United States Patent
Koya et al.

(10) Patent No.: US 7,834,370 B2
(45) Date of Patent: Nov. 16, 2010

(54) SEMICONDUCTOR LIGHT EMITTING DEVICE, ILLUMINATING DEVICE, MOBILE COMMUNICATION DEVICE, CAMERA, AND MANUFACTURING METHOD THEREFOR

(75) Inventors: Kenichi Koya, Kagoshima (JP); Yukio Kishimoto, Kyoto (JP)

(73) Assignee: Panasonic Corporation, Tokyo (JP)

( * ) Notice: Subject to any disclaimer, the term of this patent is extended or adjusted under 35 U.S.C. 154(b) by 552 days.

(21) Appl. No.: 11/667,374

(22) PCT Filed: Nov. 11, 2005

(86) PCT No.: PCT/JP2005/020731
§ 371 (c)(1),
(2), (4) Date: May 16, 2007

(87) PCT Pub. No.: WO2006/057172
PCT Pub. Date: Jun. 1, 2006

(65) Prior Publication Data
US 2007/0295980 A1  Dec. 27, 2007

(30) Foreign Application Priority Data
Nov. 25, 2004 (JP) .............................. 2004-341237

(51) Int. Cl.
*H01L 33/60* (2010.01)
(52) U.S. Cl. ................... 257/98; 257/99; 257/E27.072; 438/29
(58) Field of Classification Search ................ 257/98, 257/99, E33.072
See application file for complete search history.

(56) References Cited

U.S. PATENT DOCUMENTS

| | | | |
|---|---|---|---|
| 1,030,377 A | | 6/1912 | Barna |
| 5,886,401 A | * | 3/1999 | Liu ............................. 257/678 |
| 6,445,011 B1 | | 9/2002 | Hirano et al. |
| 6,653,661 B2 | * | 11/2003 | Okazaki ....................... 257/98 |
| 6,661,030 B2 | * | 12/2003 | Komoto et al. ................. 257/98 |
| 6,713,877 B2 | | 3/2004 | Hirano et al. |
| 7,138,662 B2 | | 11/2006 | Uemura |
| 7,176,623 B2 | * | 2/2007 | Nitta et al. ................... 313/512 |

(Continued)

FOREIGN PATENT DOCUMENTS

CN           1463047           12/2003

(Continued)

OTHER PUBLICATIONS

Japanese Office Action dated Mar. 25, 2008 for Japanese Application No. 2004-341237.

*Primary Examiner*—Davienne Monbleau
*Assistant Examiner*—Eduardo A Rodela
(74) *Attorney, Agent, or Firm*—Wenderoth, Lind & Ponack, L.L.P.

(57) ABSTRACT

A semiconductor light emitting device includes a mount member and a semiconductor light emitting element arranged on the mount member. The mount member includes a substrate; an electrode assembly (a positive electrode, a negative electrode, and bumps) that are arranged on a top surface of a substrate and contacts the semiconductor light emitting element. A reflecting member is out of contact with the semiconductor light emitting element and the electrode assembly. According to this structure, a semiconductor light emitting device can be provided, which efficiently outputs output light using a material having a high reflectance regardless of whether the material is appropriate for an electrode.

28 Claims, 15 Drawing Sheets

U.S. PATENT DOCUMENTS

| | | | |
|---|---|---|---|
| 7,296,916 B2 * | 11/2007 | Ouderkirk et al. | 362/373 |
| 7,345,323 B2 * | 3/2008 | Goetz et al. | 257/101 |
| 7,560,745 B2 * | 7/2009 | Kim et al. | 257/98 |
| 2003/0153108 A1 * | 8/2003 | Durocher et al. | 438/26 |
| 2004/0125344 A1 | 7/2004 | Matsui | |
| 2004/0164310 A1 | 8/2004 | Uemura | |
| 2006/0237741 A1 | 10/2006 | Takeuchi et al. | |

FOREIGN PATENT DOCUMENTS

| | | |
|---|---|---|
| EP | 1 030 377 | 8/2000 |
| EP | 1 395 064 | 3/2004 |
| EP | 1 712 662 | 10/2006 |
| JP | 52-047886 | 10/1975 |
| JP | 10-190066 | 7/1998 |
| JP | 2000-261040 | 9/2000 |
| JP | 2000-286457 | 10/2000 |
| JP | 2001-203386 | 7/2001 |
| JP | 2003-046137 | 2/2003 |
| JP | 2003-185813 | 7/2003 |
| JP | 2003-186427 | 7/2003 |
| JP | 2003-347600 | 12/2003 |
| JP | 2004-71393 | 3/2004 |
| JP | 2004-087935 | 3/2004 |
| JP | 2004-95941 | 3/2004 |
| JP | 2004-111623 | 4/2004 |
| JP | 2004-241318 | 8/2004 |
| JP | 2004-266168 | 9/2004 |
| JP | 2004-297056 | 10/2004 |
| WO | 01/47036 | 6/2001 |
| WO | 2004/005216 | 1/2004 |

* cited by examiner

FIG. 4

| REFLECTING MEMBER / ELECTRODE | Au | Pt | Cu | Ni | Rh | Al | Ag |
|---|---|---|---|---|---|---|---|
| Au | — | SBST290~SBST520 | SBST310~SBST520 | SBST300~SBST510 | SBST250~SBST550 | SBST200~SBST600 | SBST340~SBST800 |
| Pt | SBST200~SBST290 / SBST520~SBST800 | — | SBST200~SBST240 / SBST550~SBST800 | SBST200~SBST280 | SBST200~SBST800 | SBST200~SBST800 | SBST350~SBST800 |
| Cu | SBST200~SBST310 / SBST520~SBST800 | SBST240~SBST550 | — | SBST200~SBST350 | SBST200~SBST600 | SBST200~SBST630 | SBST350~SBST800 |
| Ni | SBST200~SBST310 / SBST510~SBST800 | SBST280~SBST800 | SBST350~SBST800 | — | SBST200~SBST800 | SBST200~SBST800 | SBST340~SBST800 |
| Rh | SBST200~SBST250 / SBST550~SBST800 | — | SBST600~SBST800 | — | — | SBST200~SBST800 | SBST370~SBST800 |
| Al | SBST600~SBST800 | — | SBST630~SBST800 | — | — | — | SBST460~SBST800 |

(UNIT: nm)
(SBST: SUBSTANTIALLY)

SEMICONDUCTOR LIGHT EMITTING DEVICE, ILLUMINATING DEVICE, MOBILE COMMUNICATION DEVICE, CAMERA, AND MANUFACTURING METHOD THEREFOR

BACKGROUND OF THE INVENTION

The present invention relates to a semiconductor light emitting device that emits light, and to a lighting device, a mobile communication apparatus, and a camera, which each includes the semiconductor light emitting device as a light source. The present invention especially relates to an art for efficiently outputting light and increasing a rate of conversion by a fluorescent substance.

In recent years, with an improvement of semiconductor techniques, semiconductor light emitting devices for lighting that output white light have become widely used.

In the semiconductor light emitting devices, a method for causing an electrode of a submount to function as a reflective film by forming the electrode larger than a semiconductor light emitting element can be used. In this case, the electrode is preferably made of metal having a high light reflectance.

Patent Reference: Japanese Patent Publication Application No. 2000-286457

However, some of metals having a high reflectance are subject to electromigration, and therefore are inappropriate for electrodes.

SUMMARY OF THE INVENTION

The present invention aims to provide a semiconductor light emitting device that efficiently outputs light including blue light emitted from a semiconductor light emitting element and green-yellow light converted by a fluorescent substance by using a material having a high reflectance regardless of whether the material is appropriate for electrodes, and a lighting device, a mobile communication apparatus, and a camera, which each includes the semiconductor light emitting device, and a method therefor.

In order to achieve the above aim, a semiconductor light emitting device according to the present invention comprises a mount member; and a semiconductor light emitting element arranged on the mount member. The mount member includes: a substrate; an electrode assembly that is arranged on a top surface of the substrate and contacts the semiconductor light emitting element; and a reflecting member that is arranged on the top surface and is out of contact with the semiconductor light emitting element and the electrode assembly.

With the structure as described above, the reflecting member is provided on the top surface of the mount member separately from the electrode assembly. Therefore, the reflecting member can be used regardless of whether the reflecting member is appropriate for electrodes.

Therefore, light emitted from the semiconductor light emitting element can be output more efficiently compared with the method of causing the electrode to function as a reflective film.

Here, in the semiconductor light emitting device, the electrode assembly may include: an electrode; and an intervening member that electrically connects the semiconductor light emitting element and the electrode.

With this structure, the electrode such as a wiring pattern on the mount member is connected with the semiconductor light emitting element via the intervening member such as a bump and a bonding wire.

Here, in the semiconductor light emitting device, the reflecting member may have a higher light reflectance than the electrode.

With this structure, the reflecting member has a higher reflectance than the electrode, and therefore more light emitted from the semiconductor light emitting element can be reflected compared with a case where the electrode is used as a reflective film.

Accordingly, luminous efficiency of the semiconductor light emitting device can be improved.

Here, in the semiconductor light emitting device, the reflecting member may be made of metal, and the electrode may be less subject to electromigration than the reflecting member.

With this structure, the electrode is made of metal less subject to electromigration than the reflecting member, and therefore this metal is a material more appropriate for electrodes than the reflecting member. Accordingly, occurrence of a short circuit fault between electrodes caused by electromigration can be suppressed.

On the other hand, the reflecting member is a material that has a higher reflectance than electrodes. Accordingly, the materials can be easily selected in accordance with various purposes.

Here, in the semiconductor light emitting device, the reflecting member may made of any of the following: Ag; an alloy including Ag; an alloy including Ag, Bi, and Nd; an alloy including Ag, Au, and Sn; Al; an alloy including Al; and an alloy including Al and Nd.

With this structure, the reflecting member can have a higher reflectance.

Here, in the semiconductor light emitting device, the reflecting member may be made of Ag or an alloy including Ag. If the electrode is made of Au or an alloy including Au as a main component, a wavelength of light emitted from the semiconductor light emitting element may be substantially in a range of 340 nm to 800 nm inclusive. If the electrode is made of Pt or an alloy including Pt as a main component, the wavelength may be substantially in a range of 350 nm to 800 nm inclusive. If the electrode is made of Cu or an alloy including Cu as a main component, the wavelength may be substantially in a range of 350 nm to 800 nm inclusive. If the electrode is made of Ni or an alloy including Ni as a main component, the wavelength may be substantially in a range of 340 nm to 800 nm inclusive. If the electrode is made of Rh or an alloy including Rh as a main component, the wavelength may be substantially in a range of 370 nm to 800 nm inclusive. If the electrode is made of Al or an alloy including Al as a main component, the wavelength may be substantially in a range of 460 nm to 800 nm inclusive.

With this structure, if Ag or an alloy including Ag is the reflecting member and each of the electrodes is made of any of Au, Pt, Cu, Ni, Rh, and Al, the reflecting member has a higher reflectance than the electrode in the above wavelength range.

Here, in the semiconductor light emitting device, the reflecting member may be made of Al or an alloy including Al. If the electrode is made of Au or an alloy including Au as a main component, a wavelength of light emitted from the semiconductor light emitting element may be substantially in a range of 200 nm to 600 nm inclusive. If the electrode is made of Pt or an alloy including Pt as a main component, the wavelength may be substantially in a range of 200 nm to 800 nm inclusive. If the electrode is made of Cu or an alloy including Cu as a main component, the wavelength may be substantially in a range of 200 nm to 630 nm inclusive. If the electrode is made of Ni or an alloy including Ni as a main component, the wavelength may be in a range of 200 nm to 800 nm inclusive. If the electrode is made of Rh or an alloy including Rh as a main component, the wavelength may be substantially in a range of 200 nm to 800 nm inclusive.

With this structure, if Al or an alloy including Al is the reflecting member and each of the electrodes is made of any of Au, Pt, Cu, Ni, and Rh, the reflecting member has a higher reflectance than the electrode in the above wavelength range.

Here, in the semiconductor light emitting device, the substrate may include Si.

With this structure, substrates that include Si generally have a low reflectance over a visible light region. Therefore, by providing the reflecting member, output light emitted from the semiconductor light emitting element can be output remarkably efficiently.

Here, in the semiconductor light emitting device, the reflecting member may include an open portion that is not covered with the semiconductor light emitting element, seen from above.

With this structure, the reflecting member formed on the uncovered portion can efficiently reflect, to a light emitting direction, light emitted from the semiconductor light emitting element in a direction opposite to the light emitting direction. Therefore, light emitted from the semiconductor light emitting element can be efficiently used. Accordingly, luminous efficiency of the semiconductor light emitting device can be improved.

Here, in the semiconductor light emitting device, the reflecting member may have a portion whose height in a vertical direction increases as a distance from the semiconductor light emitting element increases.

With this structure, by efficiently collecting light that attenuates as a distance from the semiconductor light emitting element increases, luminance unevenness and color unevenness can be suppressed.

Here, the semiconductor light emitting device may further comprise a transmittance converting unit operable to cover part or all of the semiconductor light emitting element and part or all of the reflecting member.

With this structure, light can be efficiently output such as blue light that is light of a first wavelength region emitted from the semiconductor light emitting element and green-yellow light that is light of a second wavelength region converted by a fluorescent substance, the green-yellow light being a complementary color of blue light. Also, for example, mixed color light including white light can be output with its luminance unevenness and color unevenness being suppressed. Furthermore, the portion of the reflecting member covered with the transmittance converting unit reflects at least light of the first wavelength region, and therefore a rate of conversion by a fluorescent substance can be increased.

Here, in the semiconductor light emitting device, the reflecting member may have a portion whose reflectance of light emitted from the semiconductor light emitting element increases as a distance from the semiconductor light emitting element increases.

With this structure, luminance unevenness and color unevenness can be suppressed by diffusely reflecting light, which attenuates as a distance from the semiconductor light emitting element increases, such that an amount of the light diffusely reflected increases as the distance increases.

Here, in the semiconductor light emitting device, the reflecting member may have projections and depressions formed on part or all thereof.

With this structure, the formation of the projections and depressions increases a surface area of the reflecting member. Accordingly, light of the first wavelength region can be diffusely reflected, and therefore a rate of conversion by a fluorescent substance can be increased.

Here, in the semiconductor light emitting device, the reflecting member may have a portion whose height or width of projections and depressions increase as a distance from the semiconductor light emitting element increases.

With this structure, by forming a portion on which projections and depressions are formed whose height or width increase as the distance increases. Therefore, luminance unevenness and color unevenness can be suppressed by diffusely reflecting light, which attenuates as a distance from the semiconductor light emitting element increases, such that an amount of the light diffusely reflected increases as the distance increases.

Here, in the semiconductor light emitting device, the reflecting member may have spheres formed on part or all thereof.

With this structure, the formation of the spheres increases a surface area of the reflecting member. Accordingly, light of the first wavelength region can be diffusely reflected, and therefore a rate of conversion by a fluorescent substance can be increased.

Here, in the semiconductor light emitting device, the reflecting member may have a portion on which a sphere is formed whose curvature decreases as a distance from the semiconductor light emitting element increases.

With this structure, by forming a sphere whose curvature decreases as a distance from the semiconductor light emitting element increases, a surface area of the reflecting member increases as the distance increase. Therefore, luminance unevenness and color unevenness can be suppressed by diffusely reflecting light, which attenuates as a distance from the semiconductor light emitting element increases, such that an amount of the light diffusely reflected increases as the distance increases.

Here, in the semiconductor light emitting device, an insulating unit may be provided between the reflecting member and the substrate.

With this structure, electric currents that flow to the reflecting member can be certainly intercepted, and therefore occurrence of electromigration caused by the reflecting member can be certainly prevented.

Here, in the semiconductor light emitting device, a first element electrode and a second element electrode may be provided on one of main surfaces of the semiconductor light emitting element, a first substrate electrode and a second substrate electrode may be provided as the electrode on the mount member, the first element electrode may be electrically connected with the first substrate electrode via a first micro bump included in the intervening member, and the second element electrode may be electrically connected with the second substrate electrode via a second micro bump included in the intervening member.

With this structure, light emitted from the semiconductor light emitting element can be output more efficiently in flip chip. Therefore, high luminance can be achieved.

In order to achieve the above aim, a lighting device according to the present invention comprises the semiconductor light emitting device and a lens unit that is arranged in a main light emitting direction of the semiconductor light emitting device.

With this structure, luminous efficiency of various kinds of lighting devices can be improved. The various kinds of lighting devices include indoor lights using a plurality of the semiconductor light emitting elements such as shielding lights and down lights, table lights such as stand lights, mobile lightings such as flashlights, strobe lights of cameras for photographing. Also, high luminance and energy-saving in indoor lights and table lights can be expected, and furthermore, high luminance and extension of consecutive lighting time periods and the like in mobile lightings can be expected.

In order to achieve the above aim, a mobile communication apparatus according to the present invention comprises the semiconductor light emitting device or the lighting device.

With this structure, luminous efficiency can be improved in back lights of liquid crystal displays of mobile terminal apparatuses, strobe lights for photographing still images of built-in digital cameras of mobile terminal apparatuses, lightings for moving images, and the like. Furthermore, improved operability, extension of a battery life, size-reduction, and the like can be expected.

In order to achieve the above aim, a camera according to the present invention comprises the above-described semiconductor light emitting device or lighting device.

With this structure, luminous efficiency of strobe lights of digital still cameras and silver salt cameras and lightings for video cameras is improved. Therefore, photographing using lower EV values, extension of a battery life, size-reduction, and the like in various kinds of cameras can be expected.

Here, a method for manufacturing a semiconductor light emitting device according to the present invention comprises the steps of: forming an electrode assembly on a top surface of a substrate; forming a protective film on the electrode assembly and a portion adjacent thereto; forming a film for a reflecting member on substantially all of the top surface on which the protective film is formed and the reflecting member is to be formed; and removing the protective film and the film for the reflecting member formed on the protective film.

With this structure, the protective film is formed on the electrode assembly and a separated area surrounding the electrode assembly. Protection of the electrode assembly and formation of the separated area can be performed simultaneously.

Also, in a metal for a reflecting member to be evaporated, a vertical surface thereof is difficult to be filmed compared with a horizontal surface thereof. Therefore, if the reflecting member needs to have a thick film, a film having no less than a predetermined thickness can be formed, and simultaneously, a discontinuous thin film can be formed on the vertical surface on which the reflecting member is not formed, i.e., a lateral surface of the metal for a reflecting member.

BRIEF DESCRIPTION OF THE DRAWINGS

FIG. 4 shows an appropriate combination of a wavelength range of output light, a material of an electrode, and a material of a reflecting member;

DESCRIPTION OF CHARACTERS

Figure 1A:
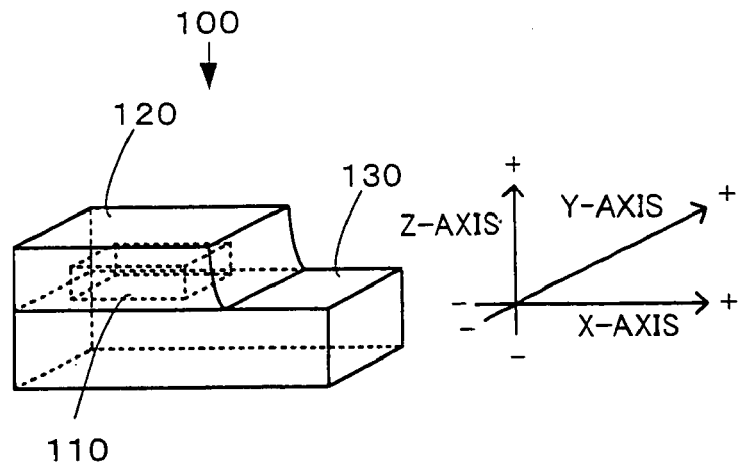
FIG. 1A is a perspective view of a semiconductor light emitting device 100 according to an embodiment of the present invention.

100: semiconductor light emitting device
110: semiconductor light emitting element
111: negative electrode
112: positive electrode
120: light-transmitting resin
130: submount (mount member)
131: silicon substrate
132: reflecting member
133: back electrode
134: positive electrode (electrode assembly)
135: negative electrode (electrode assembly)
136: bonding pad
140 to 144: micro bumps (electrode assembly)
200: lighting device
201 to 204: lead frames
205: Ag paste
206 and 207: Au wires
208: transparent epoxy resin
209: micro lens
300: mobile communication apparatus
400: camera
500: semiconductor light emitting device
510: submount (mount member)
511: positive electrode
512: reflecting member
513: silicon substrate
600: semiconductor light emitting device
610: submount (mount member)
611: reflecting member
612: silicon substrate
700: semiconductor light emitting device
710: submount (mount member)
711: reflecting member
712: silicon substrate

DETAILED DESCRIPTION OF THE INVENTION (Semiconductor Light Emitting Device)
<Structure>

An embodiment of the present invention relates to a semiconductor light emitting device. In the semiconductor light emitting device, a top surface of a mount member is slightly larger than a semiconductor light emitting element, and a reflecting member made of metal such as Ag (silver) having a higher reflectance than the electrode is provided on the top surface separately from an electrode made of Au (gold), Al (aluminum), etc. With this structure, the semiconductor light emitting device efficiently outputs light including blue light and ultraviolet light that are emitted from a semiconductor light emitting element and green-yellow light converted by a fluorescent substance, by using the reflecting member regardless of whether a material having a high reflectance is appropriate for an electrode.

FIG. 1A is a perspective view of a semiconductor light emitting device 100 according to the embodiment of the present invention. In the embodiment, as shown in FIG. 1A, an X-axis indicates the rear-to-front direction of the semiconductor light emitting device 100 ("+" indicates the front side, and "−" indicates the back side), a Y-axis indicates the right-to left direction of the semiconductor light emitting device 100 ("+" indicates the left side, and "−" indicates the right side), and a Z-axis indicates the bottom-to-top direction of the semiconductor light emitting device 100 ("+" indicates the upward direction, and "−" indicates the downward direction).

Figure 1B:
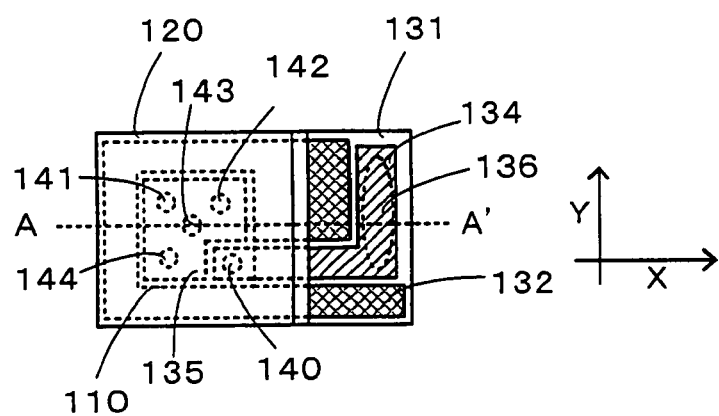
FIG. 1B is a plan view of the semiconductor light emitting device 100 shown in FIG. 1A.

FIG. 1B is a plan view of the semiconductor light emitting device 100, seen from above (from "+" direction along the Z-axis).

Figure 1C:
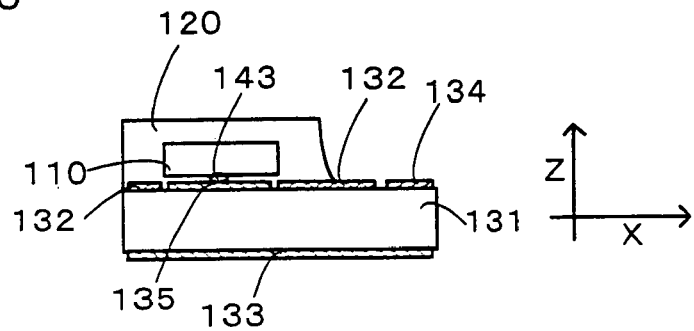
FIG. 1C is a longitudinal view of the semiconductor light emitting device 100 shown in FIG. 1A taken along line A-A'.

FIG. 1C is a longitudinal view of the semiconductor light emitting device 100 taken along line A-A', seen from right (from "−" direction along the Y-axis).

As shown in FIG. 1A, the semiconductor light emitting device 100 according to the embodiment of the present invention is a device that outputs white light, and includes a semiconductor light emitting element 110, a light-transmitting resin 120 as one example of a light-transmitting converting unit, and a submount 130 as a mount member.

Figure 2:
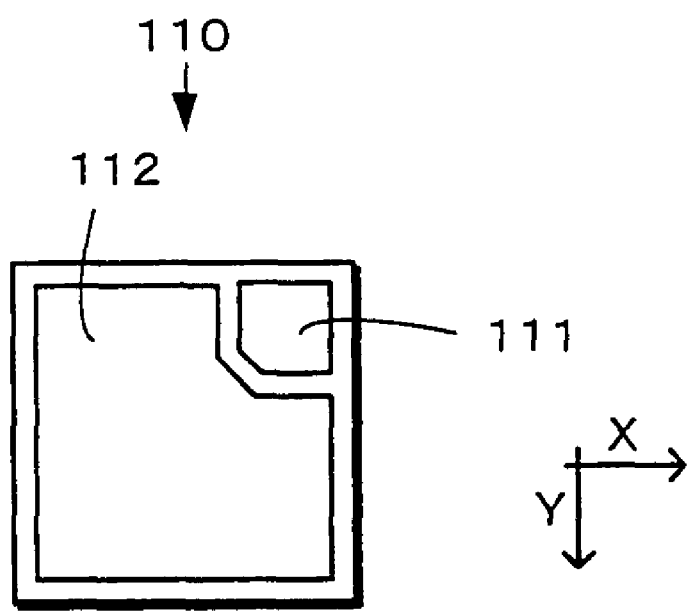
FIG. 2 is a bottom view of the semiconductor light emitting device 100 before being assembled.

FIG. 2 is a bottom view of the semiconductor light emitting element 110 before being assembled, seen from below (from "−" direction along the Z-axis), i.e., seen from a main surface of the semiconductor light emitting element 110 facing the submount 130.

The semiconductor light emitting element 110 emits blue light, and is constituted of a light emitting diode that is a light-transmitting substrate and a GaN compound semiconductor layer formed thereon. The semiconductor light emitting element 110 includes a negative electrode 111 and a positive electrode 112 found on the main surface thereof facing the submount 130, and a main light emitting portion that mainly emits light on the other surface thereof. Here, the semiconductor light emitting element 110 is a rectangular parallelepiped whose main surface being 0.3 mm square and thickness being approximately 0.1 mm, and is mounted on the submount 130 as shown in FIG. 1.

The light-transmitting resin 120 is made of a resin material that includes a fluorescent substance (not illustrated) that converts blue light emitted from the semiconductor light emitting element 110 into green-yellow light that is a complementary color of blue. The light-transmitting resin 120 transmits blue light that has not been converted into green-yellow light by the fluorescent substance and green-yellow light that has been converted by the fluorescent substance.

The light-transmitting resin 120 is mounted on the submount 130 as shown in FIG. 1, so as to cover all of the semiconductor light emitting element 110 and a surrounding portion thereof. Also, the light-transmitting resin 120 is arranged so as to cover part of the reflecting member 132.

Here, the light-transmitting resin 120 covers all of the semiconductor light emitting element 110. However, all of the semiconductor light emitting element 110 does not necessarily have to be covered, as long as part of a light emitting portion of the semiconductor light emitting element 110 is covered. Also, although the light-transmitting resin 120 covers part of the reflecting member 132, all of the reflecting member 132 may be covered.

Figure 3A:
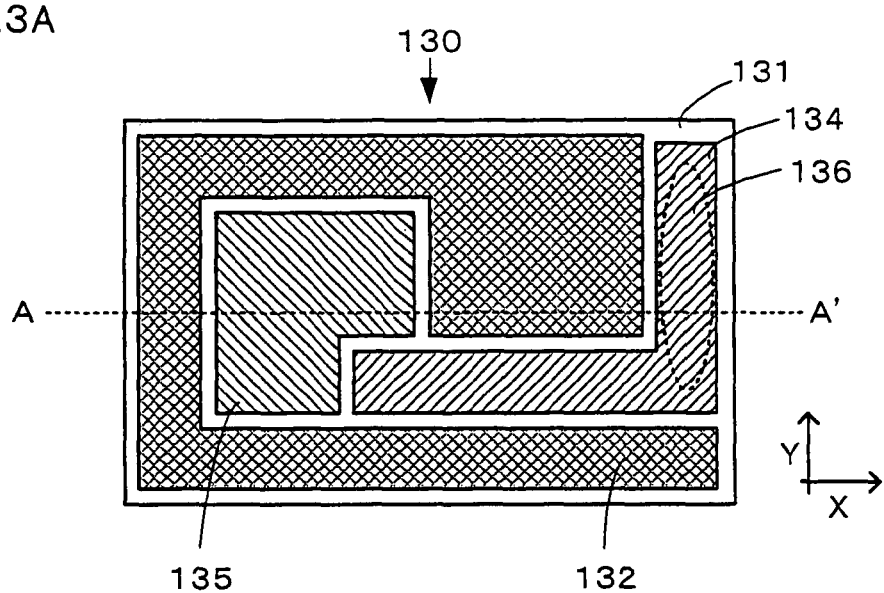
FIG. 3A is a plan view of a submount 130 before being assembled.
Figure 3B:
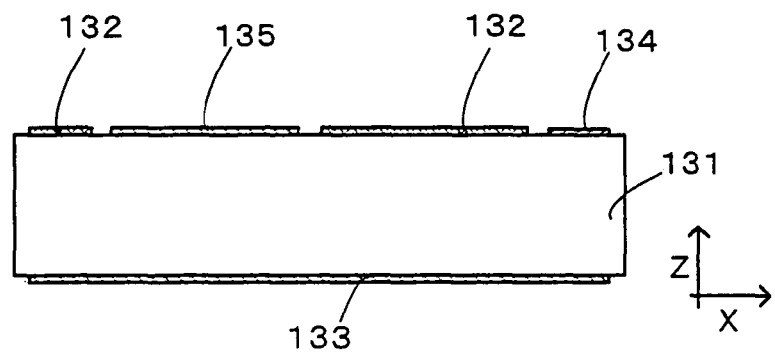
FIG. 3B is a longitudinal view of the submount 130 shown in FIG. 3A taken along line A-A'.

FIG. 3A is a plan view of the submount 130 before being assembled seen from above (from "+" direction along the Z-axis), i.e., seen from a top surface of the submount 130 on which the semiconductor light emitting element 110 is arranged. FIG. 3B is a longitudinal view of the submount 130 shown in FIG. 3A taken along line A-A' seen from the right (from "−" direction along the Y-axis).

As shown in FIG. 1A and FIG. 1C, the submount 130 is arranged under the semiconductor light emitting element 110 and the light-transmitting resin 120 (in "−" direction along the Z-axis).

The submount 130 includes a silicon substrate 131 as one example of a substrate, an electrode assembly and a reflecting member 132 that are provided on a top surface of the silicon substrate 131, and a back electrode 133 that is provided on a bottom surface of the silicon substrate 131.

The silicon substrate 131 is a substrate that includes Si, and is specifically a protective diode such as a zener diode, which is basically made of silicon.

The electrode assembly includes a positive electrode 134, a negative electrode 135, and micro bumps 140 to 144 as one example of an intervening member. The positive electrode 134 is arranged on a top surface of a p-type semiconductor region of the submount 130. The negative electrode 135 and the reflecting member 132 are arranged on a top surface of an n-type semiconductor region of the submount 130. Note that the reflecting member 132 may be arranged on the top surface of the p-type semiconductor region of the submount 130.

The back electrode 133 is made of any one of Au, Pt (platinum), Cu (copper), Ni (nickel), Rh (rhodium), Al, and Ag, or a combination of a plurality of these materials, or an alloy including any of these materials, for example.

The submount 130 is a rectangular parallelepiped whose main surface is a rectangle of 0.5 mm×0.8 mm and thickness being approximately 0.2 mm, as shown in FIG. 1A. Therefore, the submount 130 is slightly larger than the semiconductor light emitting element 110 as viewed from above, as shown in FIG. 1B.

Furthermore, the submount 130 is larger than the light-transmitting resin 120, and at least the positive electrode 134 is arranged on a portion of the submount 130 that is not covered with the light-transmitting resin 120. A portion of the positive electrode 134 that is not covered with the light-transmitting resin 120 includes a part as a bonding pad 136.

Note that various kinds of diodes such as a zener diode, a pn diode, a pin diode, a shottky barrier diode, a tunnel diode, and a gun diode can be used as the submount 130.

Here, the submount 130 that is a protective diode is connected with the semiconductor light emitting element 110 that is a light emitting diode via reversed-polarity electrodes. With such an arrangement in which the protective diode is connected with the light emitting diode, even if an attempt is made to apply a reverse voltage to the light emitting diode, a reverse voltage is hardly applied to the light emitting diode because electric current flows forward to the protective diode. Also, even if an attempt is made to apply an excessive forward voltage to the light emitting diode, a voltage higher than a reverse breakdown voltage (a zener voltage) of the protective diode is not applied.

If a silicon diode is used as the protective diode, a forward voltage is usually approximately 0.9 V, and therefore a reverse breakdown voltage can be set at approximately 10 V. As a result, a forward breakdown voltage of a GaN light emitting diode is approximately 100 V, and a reverse breakdown voltage thereof is approximately 30 V. Therefore, it is possible to prevent the light emitting diode from being destroyed by an excessive voltage caused by static electricity and the like.

A light emitting diode that emits blue light is mainly GaN-based, and has less resistance to static electricity than other bulk compound semiconductors (such as a GaP-based light emitting diode and a GaAlAs-based light emitting diode). Therefore, the arrangement in which various kinds of diodes are used as the submount 130 produces a great effect. However, the submount 130 may not necessarily be made of diodes in cases where other measures are taken against static electricity or where a semiconductor light emitting element such as other bulk compound semiconductors that has high resistance to static electricity is used.

The positive electrode 134 is an electrode, and is electrically connected with the negative electrode 111 of the semiconductor light emitting element 110 via the micro bump 140. Similarly, the negative electrode 135 is an electrode, and is electrically connected with the positive electrode 112 of the semiconductor light emitting element 110 via the micro bumps 141 to 144. When a voltage is applied between the positive electrode 134 and the negative electrode 135, the semiconductor light emitting element 110 emits light.

Each of the micro bumps 140 to 144 is a conductor that electrically connects a semiconductor light emitting element and an electrode.

Also, the positive electrode 134 and the negative electrode 135 are made of metal that has a characteristic appropriate for an electrode, such as being less subject to electromigration. For example, the positive electrode 134 and the negative electrode 135 are made of any one of Au, Pt (platinum), Cu (copper), Ni (nickel), Rh (rhodium), and Al, or a combination of a plurality of these materials, or an alloy including any of these materials, as shown at a leftmost column of table in FIG. 4.

Note that electromigration is a phenomenon that a metal component moves across above or inside a nonmetal medium under an influence of an electric field. As a use time period elapses, an insulation resistance value between electrodes decreases. This leads to a short circuit fault. In addition, no electromigration occurs where no electric field exists. For example, Ag having a comparatively high reflectance in a light wavelength range of 340 nm to 800 nm is especially subject to electromigration, and therefore is inappropriate for an electrode and cannot be used at all.

The reflecting member 132 is arranged, as shown in FIG. 1B for example, almost all over an open portion of the top surface of the silicon substrate 131 that is not covered with the semiconductor light emitting element 110 except for a portion on which the positive electrode 134 and the negative electrode 135 are provided. Also, an insulating unit (not illustrated) may be provided between the reflecting member 132 and the silicon substrate 131.

The reflecting member 132 is provided so as to be out of contact with any of the positive electrode 134, the negative electrode 135, and the semiconductor light emitting element 110. Here, to be out of contact indicates a status where the reflecting member 132 does not physically contact any of these compositional elements. This means that the reflecting member 132 may contact any of these compositional elements electrically, or via others therebetween.

When light is emitted, a voltage applied to the reflecting member 132 is smaller than that applied to the electrode assembly. Therefore, the reflecting member 132 is less influenced by an electric field, and is less subject to electromigration. Accordingly, the reflecting member 132 may be made of metal that has a characteristic inappropriate for an electrode, such as a material that would be affected by electromigration.

A material of the reflecting member 132 includes Au, Pt, Cu, Ni, Rh, and Al, for example as shown at a top column of the table in FIG. 4. Also, Ag that is subject to electromigration is used as a material of the reflecting member 132. Furthermore, any combination of a plurality of these materials, or an alloy including any of these materials may be used. In accordance with a wavelength of light emitted from the semiconductor light emitting element 110, Ag or an alloy including Ag (such as Ag—Bi and Ag—Bi—Nd), and Al or an alloy including Al can be selected.

On the other hand, when light is emitted, a larger voltage is applied to the electrode assembly, and therefore is greatly influenced by an electric field, and is subject to electromigration. Accordingly, the electrode assembly is preferably made a metal less subject to (affected by) electromigration, as described above.

Furthermore, the reflecting member 132 has a higher reflectance to light of a wave length region emitted from the semiconductor light emitting element 110 and light converted by a fluorescent substance included in the light-transmitting resin 120, than the positive electrode 134 and the negative electrode 135.

In the embodiment of the present invention, the semiconductor light emitting device has been described, which outputs, for lighting devices, white light that is mixed color light of blue light and green-yellow light. A semiconductor light emitting device that outputs white light composed of a combination of other color lights and a semiconductor light emitting device that outputs light other than white light can be realized in the same way as the semiconductor light emitting device in the embodiment, and the same effect can be expected by using these semiconductor light emitting devices.

The following describes an appropriate combination of a wavelength range of output light, a material of an electrode, and a material of a reflecting member.

FIG. 4 shows an appropriate combination of a wavelength range of output light, a material of an electrode, and a material of a reflecting member. Note that each of the chemical symbols shown in FIG. 4 indicates a metal as a material. Also, in FIG. 4, only a wavelength in a range of 200 nm to 800 nm inclusive is shown. However, the wavelength is not limited to this range.

FIG. 4 shows a combination of metals in which the reflecting member has a higher reflectance than the electrode, and can reflect more light of a wavelength region emitted from the semiconductor light emitting element shown in FIG. 4 compared with the case in which the electrode is used as a reflective film, and the electrode is less subject to electromigration.

Especially, if the reflecting member is Ag or an alloy including Ag and the electrode is Au or an alloy including Au as a main component, the wavelength of light emitted from the semiconductor light emitting element is preferably substantially in a range of 340 nm to 800 nm inclusive. If the reflecting member is Ag or an alloy including Ag and the electrode is Pt or an alloy including Pt as a main component, the wavelength of light emitted from the semiconductor light emitting element is preferably substantially in a range of 350 nm to 800 nm inclusive. If the reflecting member is Ag or an alloy including Ag and the electrode is Cu or an alloy including Cu as a main component, the wavelength of light emitted from the semiconductor light emitting element is preferably substantially in a range of 350 nm to 800 nm inclusive. If the reflecting member is Ag or an alloy including Ag and the electrode is Ni or an alloy including Ni as a main component, the wavelength of light emitted from the semiconductor light emitting element is preferably substantially in a range of 340 nm to 800 nm inclusive. If the reflecting member is Ag or an alloy including Ag and the electrode is Rh or an alloy including Rh as a main component, the wavelength of light emitted from the semiconductor light emitting element is preferably substantially in a range of 370 nm to 800 nm inclusive. If the reflecting member is Ag or an alloy including Ag and the electrode is Al or an alloy including Al as a main component, the wavelength of light emitted from the semiconductor light emitting element is preferably substantially in a range of 460 nm to 800 nm inclusive. Note here that a main component of an alloy indicates a metal that constitutes no less than 50% of a composition rate of the alloy.

Also, especially, if the reflecting member is Al or an alloy including Al and the electrode is Au or an alloy including Au as a main component, the wavelength of light emitted from the semiconductor light emitting element is preferably substantially in a range of 200 nm to 600 nm inclusive. If the reflecting member is Al or an alloy including Al and the electrode is Pt or an alloy including Pt as a main component, the wavelength of light emitted from the semiconductor light emitting element is preferably substantially in a range of 200 nm to 800 nm inclusive. If the reflecting member is Al or an alloy including Al and the electrode is Cu or an alloy including Cu as a main component, the wavelength of light emitted from the semiconductor light emitting element is preferably substantially in a range of 200 nm to 630 nm inclusive. If the reflecting member is Al or an alloy including Al and the electrode is Ni or an alloy including Ni as a main component, the wavelength of light emitted from the semiconductor light emitting element is preferably substantially in a range of 200 nm to 800 nm inclusive. If the reflecting member is Al or an alloy including Al and the electrode is Rh or an alloy including Rh as a main component, the wavelength of light emitted from the semiconductor light emitting element is preferably substantially in a range of 200 nm to 800 nm inclusive.

Furthermore, Ag and Al have a characteristic that a reflectance decreases in accordance with generation of crystal grains and cohesion of halogen that are caused by heat even if there is no influence by an electric field. In order to suppress the decrease of the reflectance, the reflecting member is preferably made of an alloy including Ag, Bi, and Nd, or an alloy including Ag, Au, and Sn, rather than an elemental Ag. Also, the reflecting member is preferably made of an alloy including Al and Nd, rather than an elemental Al. These compositions are effective especially in high luminance semiconductor light emitting devices having a high calorific value. A preferable approximate ratio by weight of each of these alloys is, Ag—Bi (0.35%)-Nd (0.2%), Ag—Au (10%)-Sn (10%), Al—Nd (2%).

Also, if the insulating unit is provided between the reflecting member and the substrate, adhesion between the reflecting member and the insulating unit is easily damaged due to the generation of crystal grains and the cohesion of halogen that are caused by the heat of Ag and Al. The formation of the reflecting member by not using an elemental metal but using an alloy as described above can suppress the damage of the adhesion between the reflecting member and the insulating unit.

Note that the semiconductor light emitting element according to the present invention is not limited to an element that emits blue light, and may be an element that emits ultraviolet light, for example. In such a case, the light-transmitting resin includes a fluorescent substance that excites blue light, red light, and green light from the ultraviolet light emitted from the semiconductor light emitting element, and is a translucent phosphor made of resin material that transmits the blue light, the red light, and the green light that are excited by the fluorescent substance.

<Method of Manufacture>

A method of manufacturing the semiconductor light emitting device 100 differs only in manufacturing the submount 130 from methods for manufacturing conventional submounts not including a reflecting member. Therefore, a method of manufacturing the submount 130 is described here, and methods for manufacturing other compositional elements of the semiconductor light emitting device 100 are simply mentioned.

Figure 5:
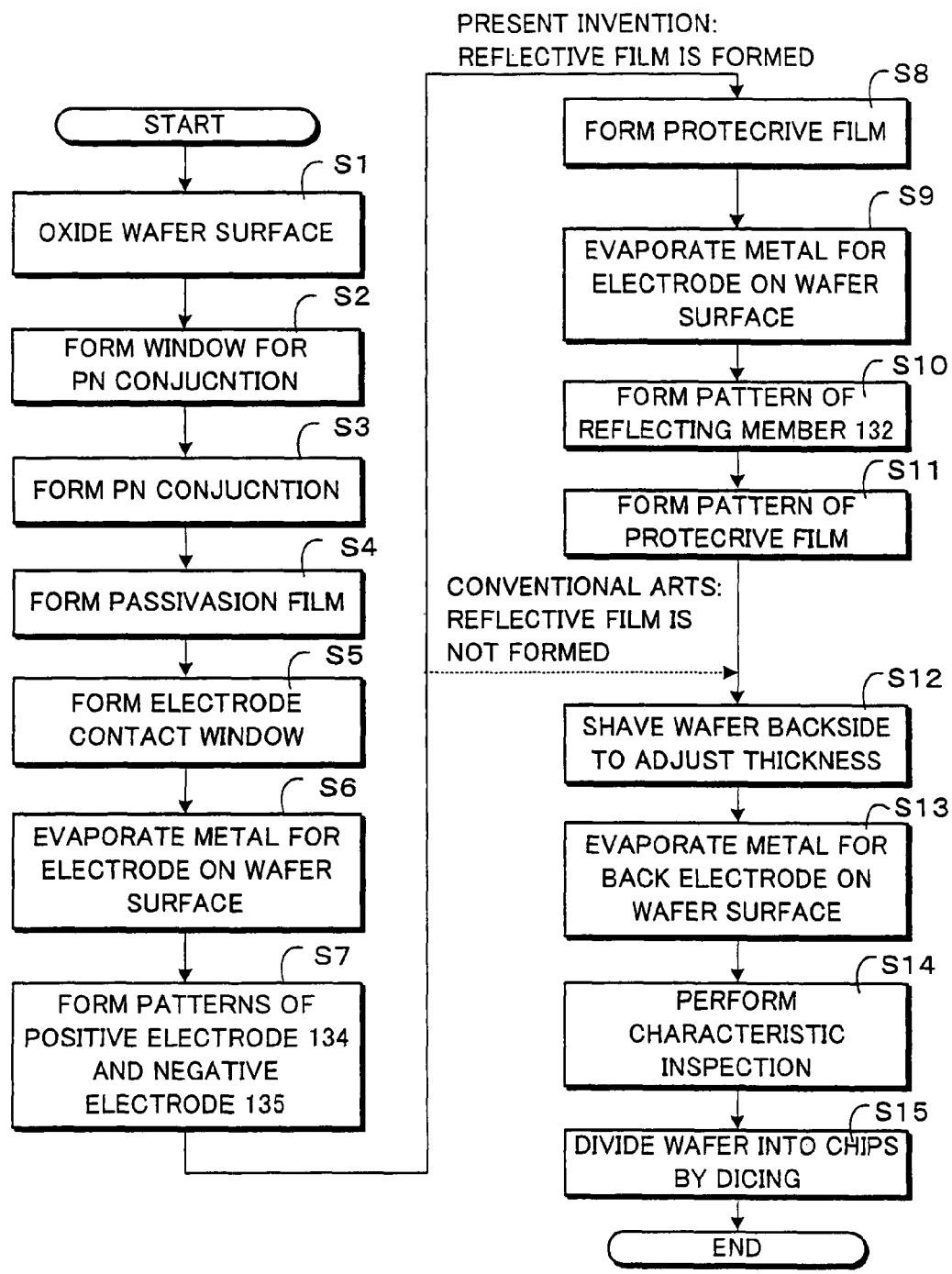
FIG. 5 is a schematic view of a method for manufacturing the submount 130.

FIG. 5 is a schematic view of a method of manufacturing the submount 130.

First, the method of manufacturing the submount 130 is described using FIG. 5.

Note that processes in Steps S1 to S7, and Steps 12 to 15 are the same as those in the methods of manufacturing conventional submounts not including a reflecting member. Processes in Steps S8 to S11 differ from those in the methods of manufacturing conventional submounts.

(Step S1) In an oxidizing process, a wafer surface of the substrate 131 that includes n-type Si, which has not been processed, is oxidized.

(Step S2) In a resisting process, a resist film is formed on the wafer surface except for a portion on which the positive electrode 134 is to be formed and a portion adjacent thereto, to form a window for forming PN junction.

(Step S3) In a diffusing process, p-type impurities are selectively diffused toward the window for forming PN junction, to form a PN junction.

(Step S4) After removing the resist film, in a process of generating an insulating unit, a passivation film having a thickness of 5000 Å to 6000 Å (such as a silicon oxide film and a silicon nitride film) as one example of an insulating unit is formed on the wafer surface using a plasma CVD equipment.

(Step S5) Part or all of the portions on which the positive electrode 134 and the negative electrode 135 are to be formed or all portions on which the insulating unit is formed are removed from the wafer surface to form an electrode contact window.

(Step S6) A metal for an electrode is evaporated on the wafer surface. Here, Al having a thickness of 2 µm to 6 µm is evaporated.

(Step S7) An unnecessary portion of the evaporated Al is removed to form patterns of the positive electrode 134 and the negative electrode 135.

Figure 6:
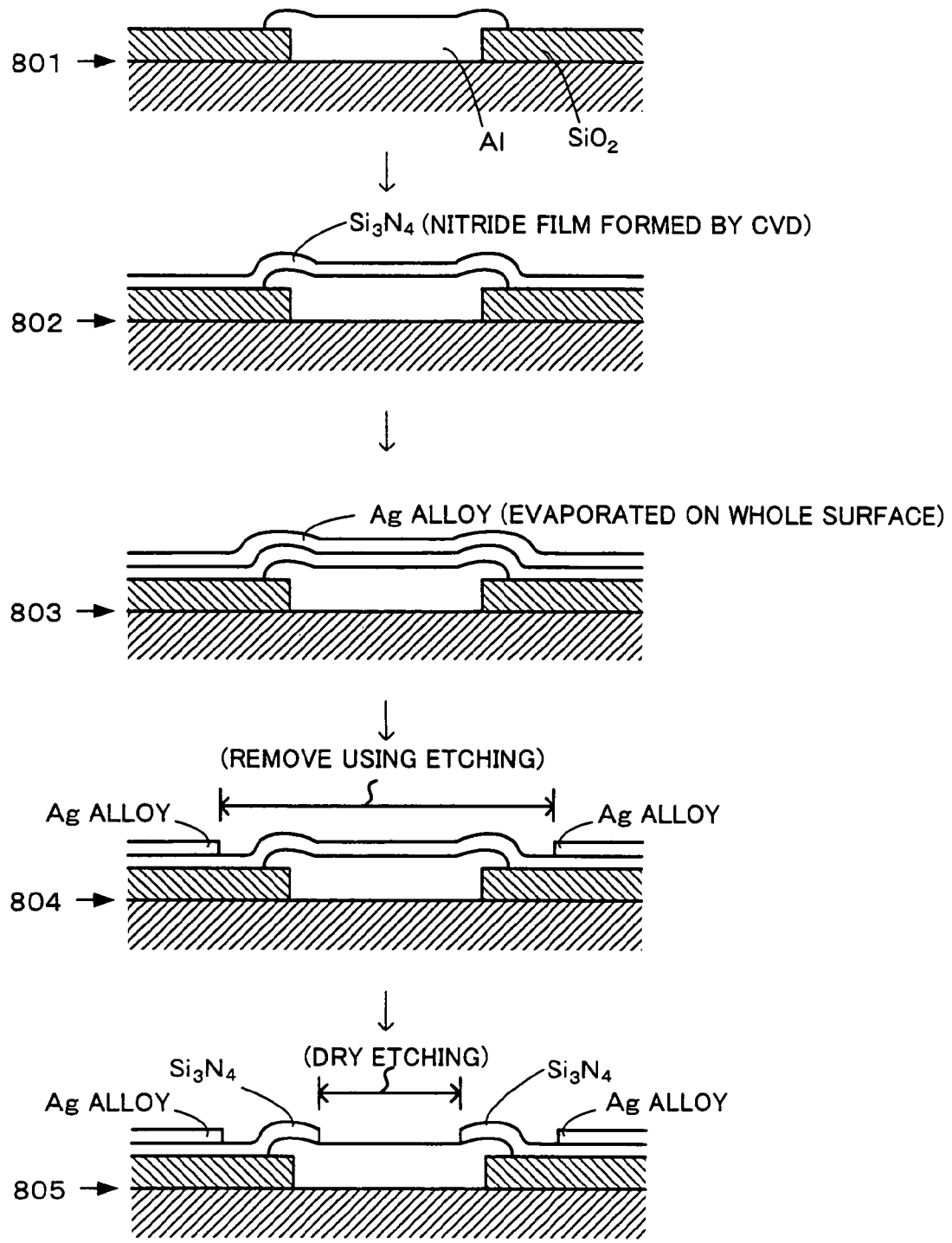
FIG. 6 is a schematic sectional view of the submount 130 in a process of forming the reflecting member.

FIG. 6 is a schematic sectional view of the submount 130 in a process of forming a reflecting member.

Numerical reference 801 in FIG. 6 shows the submount 130 on which the process of forming a reflecting member has not been performed.

(Step S8) In order to prevent an ill influence on electrodes in forming the reflecting member 132, a silicon nitride film having a thickness of 4000 Å to 5000 Å is formed on the wafer surface using the plasma CVD equipment and the like. Note that a silicon oxide film may be formed instead of the silicon nitride film.

Numerical reference 802 in FIG. 6 shows the submount 130 on which the process of Step S8 has been performed.

The silicon nitride film is formed at a comparatively low temperature of 250° C. to 400° C. by plasma CVD. Therefore, there occurs no change such as cohesion of the silicon nitride film on a surface of an Al electrode, and surfaces of the positive electrode 134 and the negative electrode 135 can be maintained being glossy. Especially, silicon nitride films have excellent humidity resistance.

(Step S9) A metal for a reflecting member having a thickness of no less than 1000 Å is evaporated on the wafer surface. Here, an Ag alloy is evaporated. A method of evaporating the Ag alloy is an electron beam method, a resistance heating method, and a sputtering method, for example.

Numerical reference 803 in FIG. 6 shows the submount 130 on which the process of Step S9 has been performed.

(Step S10) A portion that separates the reflecting member 132 and the electrode of the metal for a reflecting member, and an unnecessary portion on the surface of the electrode are removed to form a pattern of the reflecting member 132. Here, the Ag alloy is removed using wet etching, and the silicon nitride film is removed using dry etching by plasma, to form the pattern of the reflecting member 132.

Here, by removing the silicon nitride film using dry etching, the pattern of the reflecting member 132 can be formed at a comparatively low temperature (100° C. to 200° C.), and furthermore, gloss of the positive electrode 134 and the negative electrode 135 can be prevented from being decreased due to contamination by acids.

Also here, by forming the silicon nitride film so as to cover a portion surrounding the surface of the electrode, an interface between the electrode and the insulating unit is protected, and also the electrode having a low adhesion is prevented from being detached from the insulating unit.

Numerical reference 804 in FIG. 6 shows the submount 130 on which a process of Step S10 has been performed.

(Step S11) A portion where the micro bumps 140 to 144 are to be formed and a surrounding portion thereof that are on the positive electrode 134 and the negative electrode 135 are removed, to form a pattern of the silicon nitride film.

Numerical reference 805 in FIG. 6 shows the submount 130 on which the process of Step S11 has been performed.

(Step S12) A wafer backside is shaved to adjust a thickness thereof in a range of 100 μm to 200 μm.

(Step S13) A metal for a back electrode such as Au and Ag is evaporated on the wafer surface using the electron beam method, the sputtering method, the resistance heating method, and the like, to form the back electrode 133.

(Step S14) A characteristic inspection is performed. Position information of a defective element that does not satisfy a specification is stored. The stored position information of the defective element is used for discarding the defective element when die bonding is performed.

(Step S15) A wafer is attached onto a dicing tape, and is divided into chips by dicing.

In this way, the submount 130 can be manufactured using the above method.

Note that, in the above manufacturing method, complicated processes need to be performed in order to remove unnecessary portions, such as wet etching used for removing unnecessary portions of the reflecting member, dry etching used for removing unnecessary portions of the silicon nitride film, and the like. Therefore, processes for removing unnecessary portions (Step 8 to Step 11) may be replaced with the following more simplified processes (Step 21 to Step 23).

Figure 7:
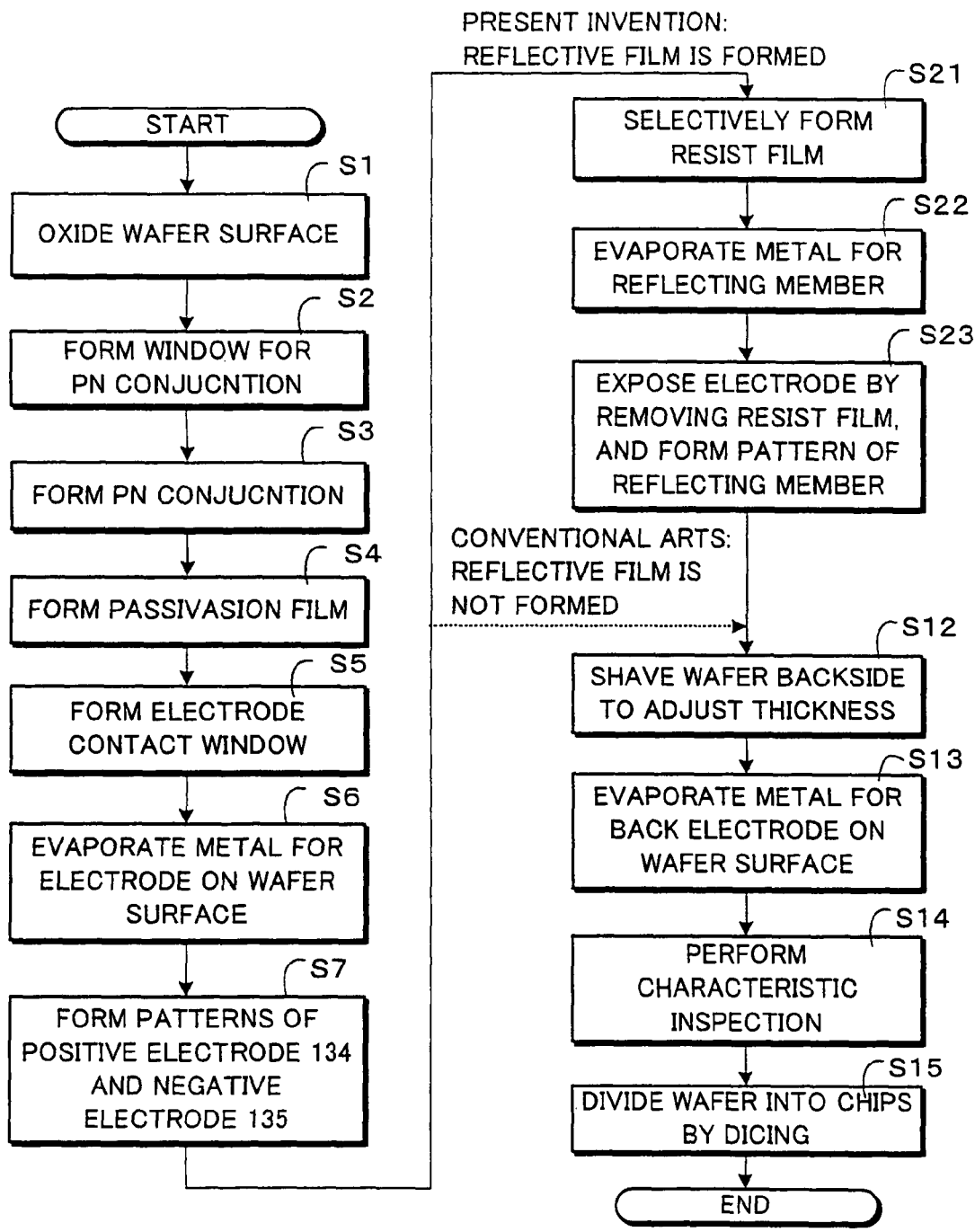
FIG. 7 is a schematic view of a method for manufacturing the submount 130.

FIG. 7 is a schematic view of a method for manufacturing the submount 130.

Figure 8:
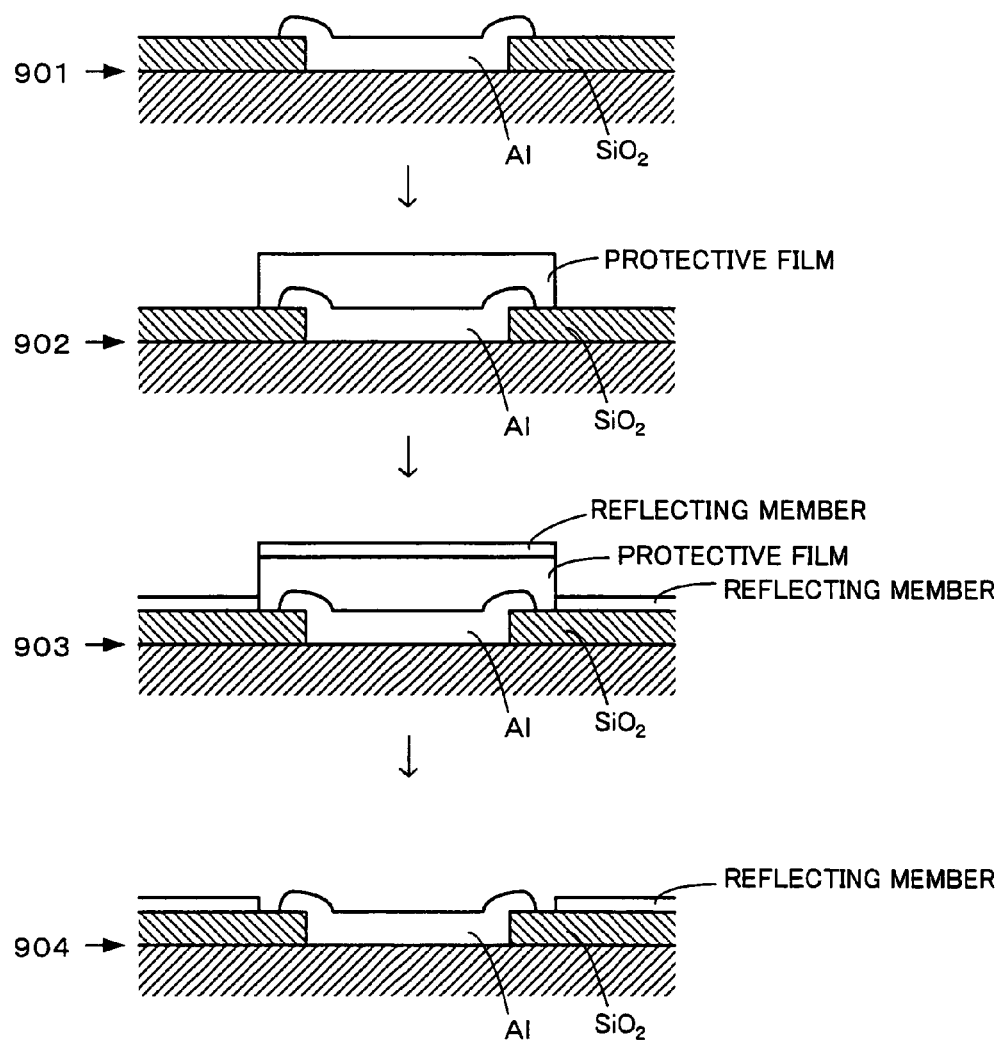
FIG. 8 is a schematic sectional view of the submount 130 in a process of forming the reflecting member.

FIG. 8 is a schematic sectional view of the submount 130 in a process of forming the reflecting member.

Numerical reference 901 in FIG. 8 shows a section of the submount 130 on which the process of forming the reflecting member has not been performed.

(Step S21) In order to prevent an ill influences on the electrode in forming the reflecting member 132, a resist film having a thickness of 2 μm to 3 μm as one example of a protective film is selectively formed on portions on which the positive electrode 134 and the negative electrode 135 are arranged and portions adjacent thereto.

At this time, the protective film has lateral surfaces extending in the vertical direction, and preferably has a thickness of approximately ten times of a thickness of the later-formed reflecting member. This can ensure liftoff of the protective film, taking advantage of a characteristic that a speed of evaporation for forming the reflecting member decreases as an angle of a surface to be evaporated becomes more perpendicular.

Numerical reference 902 in FIG. 8 shows the submount 130 on which the process of Step S21 has been performed.

(Step S22) A metal for a reflecting member is evaporated as a film for a reflecting member, on almost all the wafer surface (the top surface of the substrate) that is composed of the portion on which the protective film is formed and a portion on which the reflecting member 132 is to be formed.

At this time, a metal to be evaporated is preferably formed so as to have a thickness in a range of 1000 Å to 4000 Å. This is due to the following reasons. If having a film thickness of less than 1000 Å, the metal cannot function as a reflecting member. Also, if having a film thickness of no more than 4000 Å, the metal can have an aperture formed on a part of one of the lateral surfaces extending in the vertical direction of the protective film and the protective film can be easily removed using the liftoff mechanism of the protective film. Furthermore, the use of an organic resist can remove the protective film in a comparatively short time period using an organic solvent. Therefore, acids have no need to be used, which affects gloss of the surfaces of the electrode.

Note here that, when a metal is evaporated, a metal is evaporated such as titanium that has difficulty reacting with the wafer surface, and then a metal having a high reflectance is evaporated thereon such as Ag and an Ag-alloy, such that the submount has a double structure.

Numerical reference 903 in FIG. 8 shows the submount 130 on which the process of Step S22 has been performed.

(Step S23) The protective film is removed together with the film for the reflecting member formed on the protective film using a solvent dipping method and the like, to expose the positive electrode 134 and the negative electrode 135. Also, the film for the reflecting member is left only in an area away from the electrode to form a pattern of the reflecting member.

Numerical reference 904 in FIG. 8 shows the submount 130 on which the process of Step S23 has been performed.

As described above, by forming the protective film on the electrode and the separated portion surrounding the electrode in Step S21, the protection of the electrode and the formation of the separated portion can be performed simultaneously.

Also, the metal for a reflecting member to be evaporated has a vertical surface more subject to be filmed than a horizontal surface thereof. Therefore, a film having no less than a predetermined thickness can be formed for the reflecting member 132 that needs to have a thick film. And also on the vertical surface of the metal, i.e., one of the lateral surfaces of the metal, a discontinuous thin film on which the reflecting member 132 is not formed can be formed.

Figure 9:
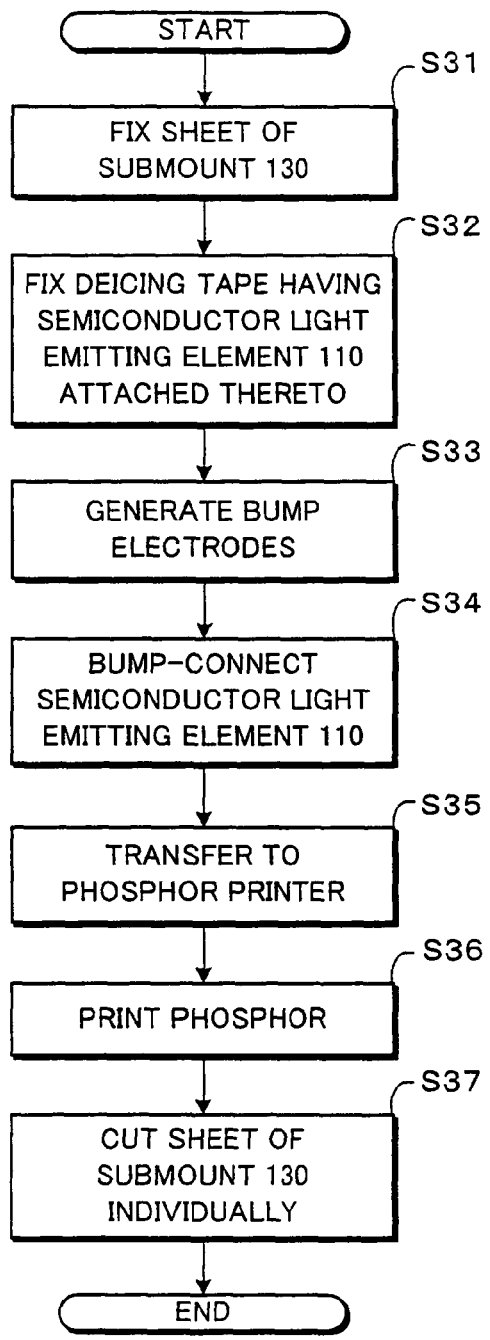
FIG. 9 is a schematic view of a method for manufacturing the semiconductor light emitting device 100.

FIG. 9 is a schematic view of a method for manufacturing the semiconductor light emitting device 100.

A method of manufacturing the semiconductor light emitting device 100 is described using FIG. 9.

(Step S31) The submount 130 is fixed at a predetermined position on a die bonding device.

(Step S32) The semiconductor light emitting element 110 is fixed at a predetermined position on the die bonding device.

(Step S33) The micro bumps 140 to 144 are formed at each position on the submount 130 where the semiconductor light emitting element 110 is to be bump-connected.

(Step S34) Each of the semiconductor light emitting element 110 is selected one by one, and is bump-connected to each of the submounts 130.

(Step S35) After bump-connecting the semiconductor light emitting element 110 to the submount 130, the submount 130 is transferred to a phosphor printer employing a metal plate.

(Step S36) In the phosphor printer, a phosphor is printed on the semiconductor light emitting elements 110 on the submount 130 and a surrounding area thereof to be printed.

(Step S37) In this way, the semiconductor light emitting device 100 is manufactured.

<Conclusion>

According to the semiconductor light emitting device in the embodiment of the present invention, a reflecting member made of a material having a high reflectance is provided separately from an electrode, so as not to be influenced by an electric field. With the use of the reflecting member, an excellent effect can be achieved that output light including blue light and ultraviolet light emitted from a semiconductor light emitting element and green-yellow light converted by a fluorescent substance can be output efficiently, regardless of whether the material having a high reflectance is subject to electromigration.

(First Modification)

<Structure>

A first modification of the present invention relates to a semiconductor light emitting device that is a modification of the semiconductor light emitting device in the embodiment. In the semiconductor light emitting device according to the first modification example, a reflecting member has an inclined portion such that a height in a light emitting direction increases as a distance increases from a semiconductor light emitting element. By efficiently collecting light that attenuates as a distance decreases from the semiconductor light emitting element, luminance unevenness and color unevenness are suppressed.

A semiconductor light emitting device 500 according to the first modification example is a device that outputs white light in the same way as the semiconductor light emitting device 100 in the embodiment. The semiconductor light emitting device 500 includes a semiconductor light emitting element 110, a light-transmitting resin 120, and a submount 510 as a mount member. The submount 130 in the embodiment is replaced with submount 510 here.

Figure 10A:
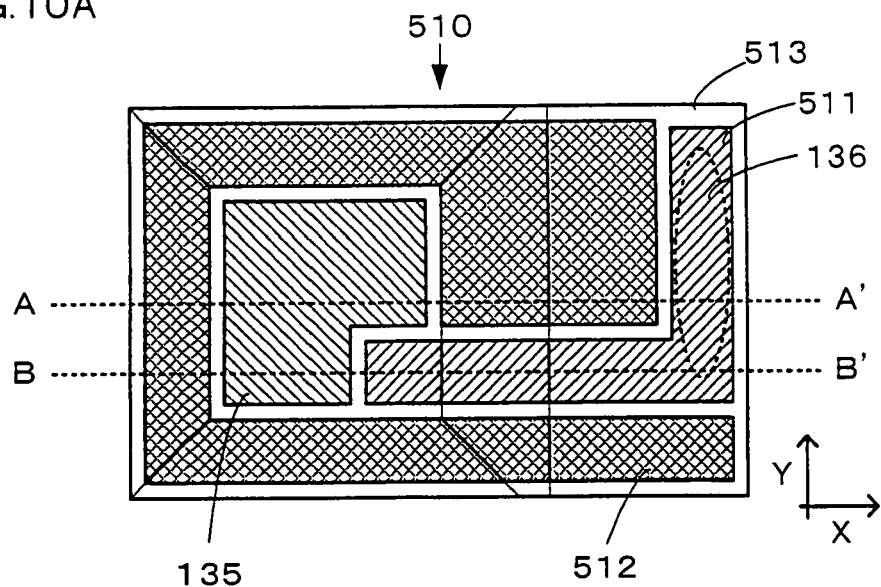
FIG. 10A is a plan view of a submount 510 before being assembled.
Figure 10B:
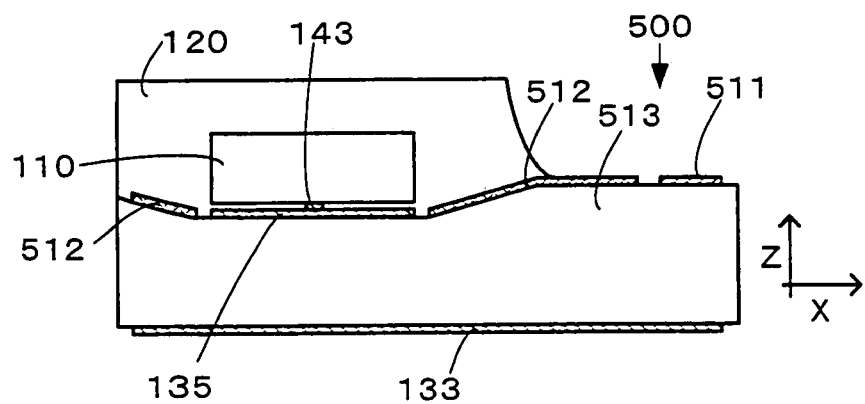
FIG. 10B is a longitudinal view of a semiconductor light emitting device 500 taken along line A-A' of the submount 510 shown in FIG. 10A.
Figure 10C:
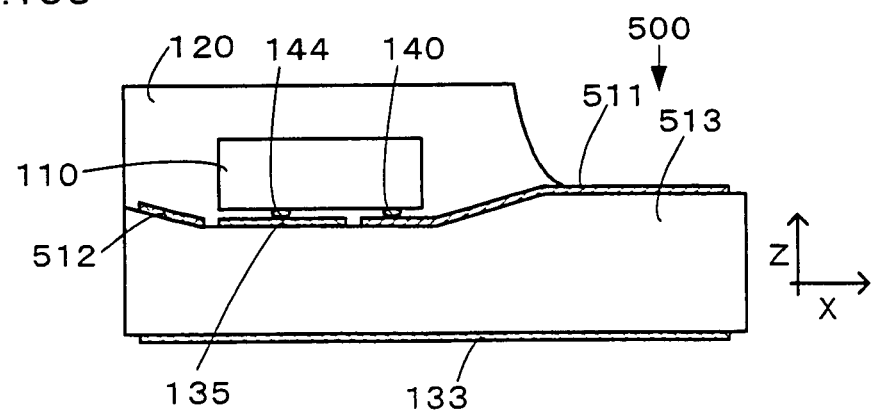
FIG. 10C is a longitudinal view of the semiconductor light emitting device 500 taken along line B-B' of the submount 510 shown in FIG. 10A.

FIG. 10A is a plan view of the submount 510 before being assembled. FIG. 10B is a longitudinal view of the semiconductor light emitting device 500 taken along line A-A' of the submount 510 shown in FIG. 10A. FIG. 10C is a longitudinal view of the semiconductor light emitting device 500 taken along line B-B' of the submount 510 shown in FIG. 10A. Each of directions indicated by an X-axis, a Y-axis, and a Z-axis shown in FIG. 10 is based on the definition shown in FIG. 1A.

As shown in FIG. 10A, as the same as the submount 130 in the embodiment, the submount 510 in the first modification example of the present invention includes a silicon substrate 513 that is a protective diode such as a zener diode, which is basically made of silicon. The submount 510 is arranged under the semiconductor light emitting element 110 and the light-transmitting resin 120. On a main surface of an upper side of the silicon substrate 513 on which the semiconductor light emitting element 110 and the light-transmitting resin 120 are arranged, i.e., on a top surface of the silicon substrate 513, a positive electrode 511, a negative electrode 135, a reflecting member 512, and micro bumps 140 to 144 are provided. Also, on a main surface of a bottom side of the silicon substrate 513, i.e., on a bottom surface of the silicon substrate 513, a back electrode 133 is provided. The positive electrode 134 in the embodiment is replaced with the positive electrode 511 here, and the reflecting member 132 in the embodiment is replaced with the reflecting member 512 here.

The positive electrode 511 differs from the positive electrode 134 only in shape. A portion of the positive electrode 511 that is covered with the light-transmitting resin 120 and does not have arranged thereon the semiconductor light emitting element 110 has an inclined portion, such that a height in a light emitting direction increases as a distance from the semiconductor light emitting element 110 increases. Other characteristics of the positive electrode 511 such as a material are the same as those of the positive electrode 134. Here, a portion of the positive electrode 511 that is not covered with the light-transmitting resin 120 does not have an inclined portion. This is for not changing a shape of a bonding pad 136. This uncovered portion may be inclined as the same as the portion that is covered with the light-transmitting resin 120.

The reflecting member 512 differs from the reflecting member 132 only in shape, and has an inclined portion that is at least covered with the light-transmitting resin 120, such that a height in a light emitting direction increases as a distance from the semiconductor light emitting element 110 increases. Other characteristics of the reflecting member 512 such as a material are the same as those of the reflecting member 132. Here, a portion of the reflecting member 512 that is not covered with the light-transmitting resin 120 does not have an inclined portion. This is because the shape of the reflecting member 512 is adjusted with the shape of the positive electrode 511. The uncovered portion may be inclined the same as the portion of the reflecting member 512 that is covered with the light-transmitting resin 120.

<Method of Manufacture>

In order to form an inclined portion on the top surface of the submount 510, the following may be employed, for example. A positive photoresist is applied onto the substrate. The substrate is exposed via a gradation mask. The photoresist is developed and rinsed to form a surface shape pattern having an inclined portion by the photoresist on the substrate. And then, anisotropic dry etching and sandblasting are performed on the photoresist and the substrate using the formed surface shape pattern as a mask. The surface shape pattern of the photoresist is formed on the surface of the substrate.

<Conclusion>

As have been described, according to the first modification example of the present invention, in the positive electrode and the reflecting member, a portion at least covered with the light transmitting resin is inclined such that a height in the vertical direction increases as a distance from the semiconductor light emitting element increases. Therefore, light can be efficiently collected, which attenuates as a distance increases from the semiconductor light emitting element increases, and luminance unevenness and color unevenness can be suppressed.

(Second Modification Example)
<Structure>

A second modification example of the present invention relates to a modification of the semiconductor light emitting device in the embodiment. In the semiconductor light emitting device according to the second modification example, projections and depressions are formed on a surface of the reflecting member. This leads to an increase of the surface to improve a reflective efficiency thereof, and also leads to diffuse reflection of light to improve a conversion efficiency of a wavelength. Furthermore, luminance unevenness and color unevenness are suppressed by forming projections and depressions whose height or width increase as a distance from the semiconductor light emitting element increases and therefore diffusely reflecting light that attenuates as the distance increases such that an amount of the light diffusely reflected increases as the distance increases.

A semiconductor light emitting device 600 according to the second modification example is a device that outputs white light in the same way as the semiconductor light emitting device 100 according to the embodiment. The semiconductor light emitting device 600 includes a semiconductor light emitting element 110, a light-transmitting resin 120, and a submount 610 as a mount member. The submount 130 in the embodiment is replaced with the submount 610 here.

Figure 11A:
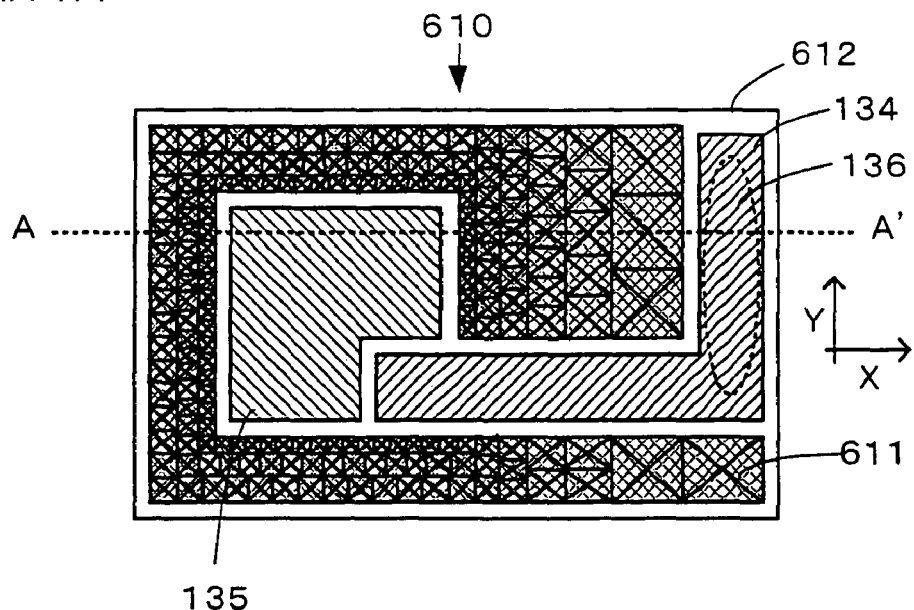
FIG. 11A is a plan view of a submount 610 before being assembled.
Figure 11B:
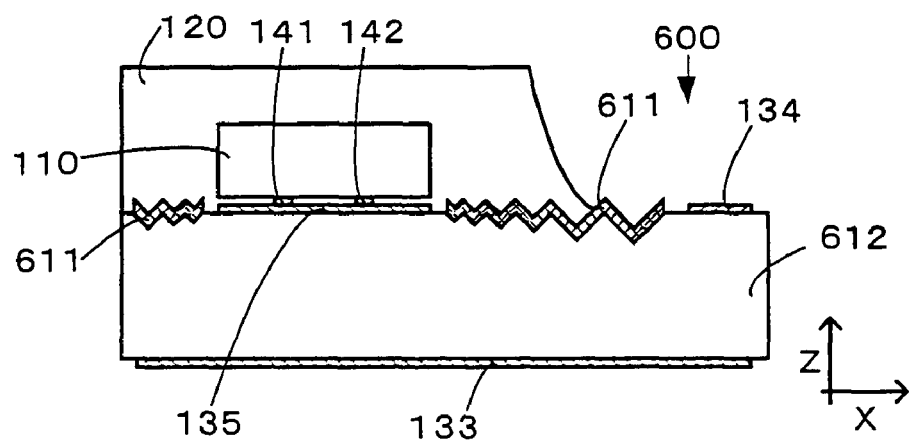
FIG. 11B is a longitudinal view of a semiconductor light emitting device 600 taken along line A-A' of the submount 610 shown in FIG. 11A.

FIG. 11A is a plan view of the submount 610 before being assembled, seen from a top surface thereof on which the semiconductor light emitting element 110 is arranged. FIG. 11B is a longitudinal view of the semiconductor light emitting device 600 taken along line A-A' of the submount 610 shown in FIG. 11A. Note that each of directions indicated by an X-axis, a Y-axis, and a Z-axis shown in FIG. 11 is based on the definition shown in FIG. 1A.

As shown in FIG. 11A, as the same as the submount 130 in the embodiment, the submount 610 in the second modification example of the present invention includes a silicon substrate 612 that is a protective diode such as a zener diode, which is basically made of silicon. The submount 610 is arranged under the semiconductor light emitting element 110 and the light-transmitting resin 120. On a main surface of an upper side of the silicon substrate 612 on which the semiconductor light emitting element 110 and the light-transmitting resin 120 are arranged, i.e., on a top surface of the silicon substrate 612, a positive electrode 134, a negative electrode 135, a reflecting member 611, and micro bumps 140 to 144 are provided. Also, on a main surface of a under side of the silicon substrate 612, i.e., on a bottom surface of the silicon substrate 612, a back electrode 133 is provided. The reflecting member 132 in the embodiment is replaced with the reflecting member 611 here.

The reflecting member 611 differs from the reflecting member 132 only in shape, and has projections and depressions on a surface thereof. A height or a width of the projections and depressions increase as a distance from the semiconductor light emitting element 110 increases. Other characteristics of the reflecting member 611 such as a material are the same as those of the reflecting member 132.

Here, projections and depressions are not provided on the positive electrode 134. However, projections and depressions may be provided as the same as the reflecting member 611.

<Method of Manufacture>

In order to form projections and depressions on the top surface of the submount 610, the following may be employed, for example. A positive photoresist is applied onto the substrate. The substrate is exposed via a gradation mask. The photoresist is developed and rinsed to form a surface shape pattern having projections and depressions by the photoresist. And then, anisotropic dry etching and sandblasting is performed on the photoresist and the substrate using the formed surface shape pattern. The surface shape pattern of the photoresist is formed on the surface of the substrate.

<Conclusion>

As have been described, according to the second modification example of the present invention, projections and depressions are formed on the surface of the reflecting member. This leads to an increase of the surface to improve a reflective efficiency thereof, and also leads to diffuse reflection of light to improve a conversion efficiency of a wavelength.

Furthermore, luminance unevenness and color unevenness are suppressed by forming projections and depressions whose height or width increases as a distance from the semiconductor light emitting element increases and therefore diffusely reflecting light that attenuates as the distance increases such that an amount of the light diffusely reflected increases as the distance increases.

Note that, in order to suppress color unevenness, projections and depressions may be provided on a portion of the reflecting member that is at least covered with the light-transmitting resin and on which the semiconductor light emitting element is not arranged, and also, at least blue light emitted from the semiconductor light emitting element may be reflected.

(Third Modification)
<Structure>

A third modification example of the present invention relates to a semiconductor light emitting device that is the semiconductor light emitting device in the embodiment. In the semiconductor light emitting device according to the third modification example, spheres are formed on the surface of the reflecting member. This leads to an increase of the surface to improve a reflective efficiency thereof, and also leads to diffuse reflection of light to improve a conversion efficiency of a wavelength. Furthermore, luminance unevenness and color unevenness are suppressed by forming a sphere whose curvature decreases as a distance from the semiconductor light emitting element increases, and diffusely reflecting light that attenuates as a distance from the semiconductor light emitting element increases.

A semiconductor light emitting device 700 according to the third modification example is a device that outputs white light in the same way as the semiconductor light emitting device 100 according to the embodiment. The semiconductor light emitting device 600 includes a semiconductor light emitting element 110, a light-transmitting resin 120, and a submount 710 as a mount member. The submount 130 in the embodiment is replaced with the submount 710 here.

Figure 12A:
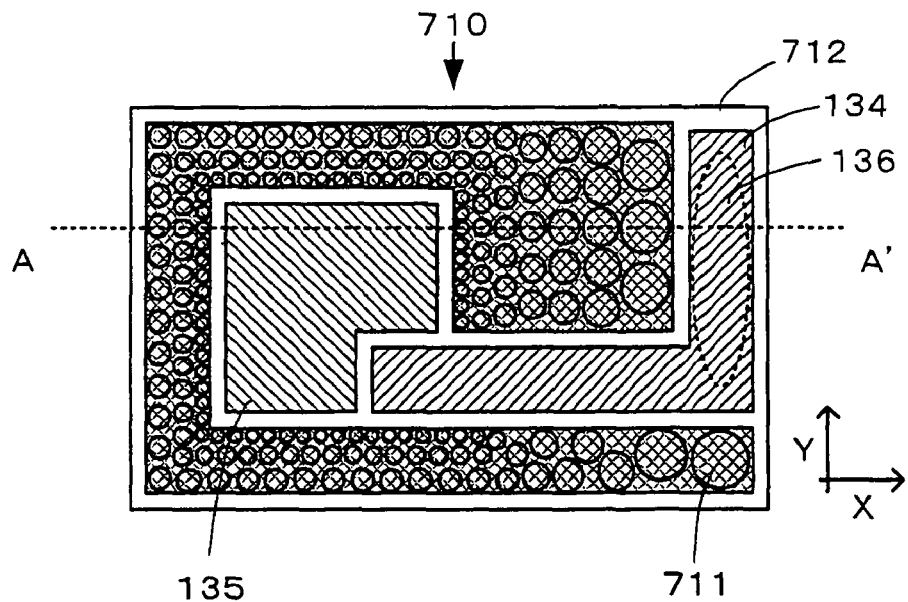
FIG. 12A is a plan view of a submount 710 before being assembled.
Figure 12B:
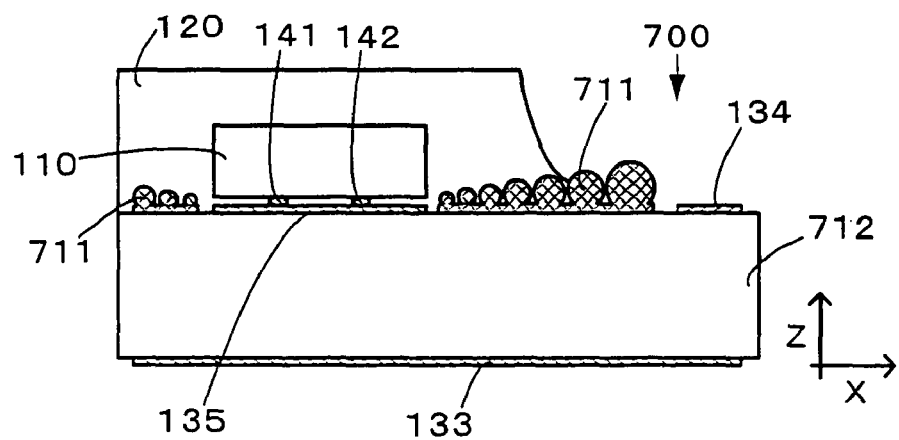
FIG. 12B is a longitudinal view of a semiconductor light emitting device 700 taken along line A-A' of the submount 710 shown in FIG. 12A.

FIG. 12A is a plan view of the submount 710 before being assembled, and FIG. 12B is a longitudinal view of the semiconductor light emitting device 700 taken along line A-A' of the submount 710 shown in FIG. 12A. Note that each of directions indicated by an X-axis, a Y-axis, and a Z-axis shown in FIG. 10 is based on the definition shown in FIG. 1A.

As shown in FIG. 12A, as the same as the submount 130 according to the embodiment, the submount 710 according to the third modification example includes a silicon substrate 712 that is a protective diode such as a zener diode, which is basically made of silicon. The submount 710 is arranged under the semiconductor light emitting element 110 and the light-transmitting resin 120. On a main surface of an upper side of the silicon substrate 712 on which the semiconductor light emitting element 110 and the light-transmitting resin 120 are arranged, i.e., on a top surface of the silicon substrate 712, a positive electrode 134, a negative electrode 135, a reflecting member 711, and micro bumps 140 to 144 are provided. Also, on a main surface of a bottom side of the silicon substrate 712, i.e., on a bottom surface of the silicon substrate 712, a back electrode 133 is provided. The reflecting member 132 in the embodiment is replaced with the reflecting member 711 here.

The reflecting member 711 differs from the reflecting member 132 only in shape of a surface thereof. The reflecting member 711 has spheres on a surface thereof. A curvature of a sphere decreases as a distance from the semiconductor light emitting element increases. Other characteristics of the reflecting member 711 such as a material are the same as those of the reflecting member 132.

Here, the positive electrode 134 does not have spheres thereon. However, spheres may be provided on the positive electrode 134 as the same as the reflecting member 711.

<Manufacturing Method>

In order to provide spheres on the submount 710, a process may be performed using conventional methods for forming bumps.

Also, in order to form hemispheres on the top surface of the submount 710, the following may be employed, for example. A positive photoresist is applied onto the substrate. The substrate is exposed via a gradation mask. The photoresist is developed and rinsed to form a hemisphere surface shape pattern by the photoresist. And then, anisotropic dry etching and sandblasting are performed on the photoresist and the substrate using the formed hemisphere surface shape pattern. The surface shape pattern of the photoresist is formed on the surface of the substrate.

<Conclusion>

As has been described, according to the third modification example of the present invention, spheres are formed on the surface of the reflecting member. This leads to an increase of the surface to improve a reflective efficiency thereof, and also leads to diffuse reflection of light to improve a conversion efficiency of a wavelength.

Furthermore, luminance unevenness and color unevenness are suppressed by forming spheres whose curvature decreases as a distance from the semiconductor light emitting element increases and therefore diffusely reflecting light that attenuates as the distance increases, such that an amount of the light diffusely reflected increases as the distance increases.

Note that, in order to suppress color unevenness, spheres may be provided on a portion of the reflecting member that is at least covered with the light-transmitting resin and on which the semiconductor light emitting element is not arranged, and also, at least blue light emitted from the semiconductor light emitting element may be reflected.

(Lighting Device)

Figure 13:
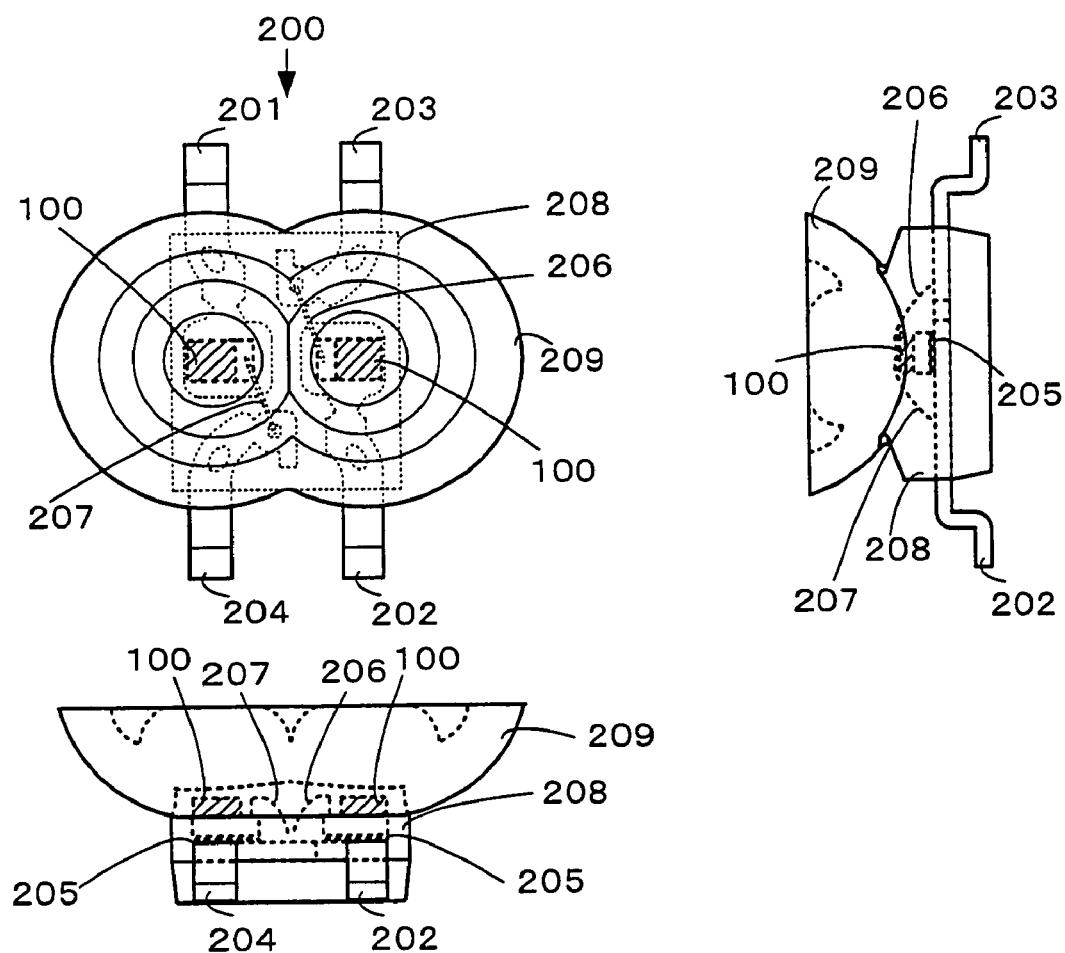
FIG. 13 shows a lighting device 200 having the semiconductor light emitting device 100 as a light source.

FIG. 13 shows a lighting device 200 having the semiconductor light emitting device 100 as a light source.

The lighting device 200 shown in FIG. 13 is composed as follows. Each of the semiconductor light emitting devices 100 is die bonded to each of lead frames 201 and 202 using an Ag paste 205. Each of lead frames 203 and 204 is wire bonded to a bonding pad 136 on each of the semiconductor light emitting devices 100 via Au wires 206 and 207. And, they are molded using a transparent epoxy resin 208. Then, a micro lens having total reflection parabola 209 is installed thereon.

Note that a lighting device having the semiconductor light emitting device 100 as a light source is not limited to the lighting device 200 shown in FIG. 13, and may be any lighting device, for example, an indoor light using many semiconductor light emitting devices such as a shielding light and a down light, a table light such as a stand light, a mobile lighting such as a flashlight, a strobe light for cameras.

As has been described, the lighting device according to the embodiment of the present invention can exhibit the same effect that is exhibited by the above-described semiconductor light emitting device. Especially, improvement in luminous efficiency is expected to realize high luminance and energy-saving in indoor lights and table lights, and is also expected to realize high luminance and extension of a consecutive lighting time period in mobile lightings, and the like.

(Mobile Communication Apparatus)

Figure 14:
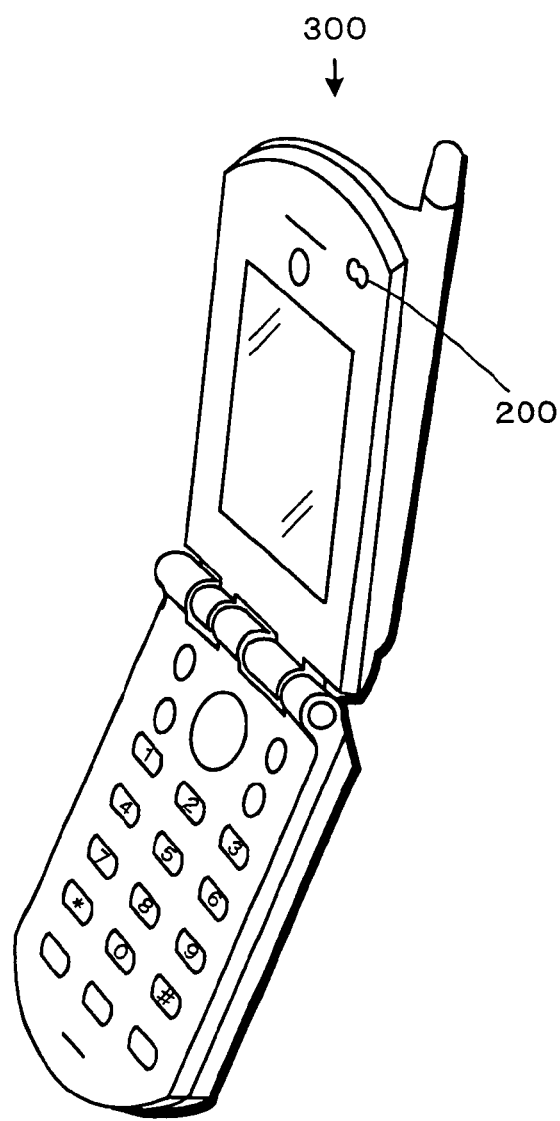
FIG. 14 shows a mobile terminal apparatus 300 having mounted thereon the lighting device 200 as a strobe light for photographing.

FIG. 14 shows a mobile terminal apparatus 300 having mounted thereon the lighting device 200 as a strobe light for photographing.

Note that a mobile terminal apparatus having mounted thereon the semiconductor light emitting device 100 is not limited to the mobile terminal apparatus 300 shown in FIG. 14, and may be a mobile terminal apparatus used for any purpose, for example a back light of liquid crystal displays of a mobile terminal apparatus, a strobe light for photographing still images of a built-in digital camera, a lighting for moving images, and the like.

As has been described, the mobile terminal apparatus according to the embodiment of the present invention can exhibit the same effect that is exhibited by the above-described semiconductor light emitting device. Especially, improvement in luminous efficiency is expected to improve operability, realize extension of a battery life and size-reduction, and the like in mobile communication terminals.

(Camera)

Figure 15:
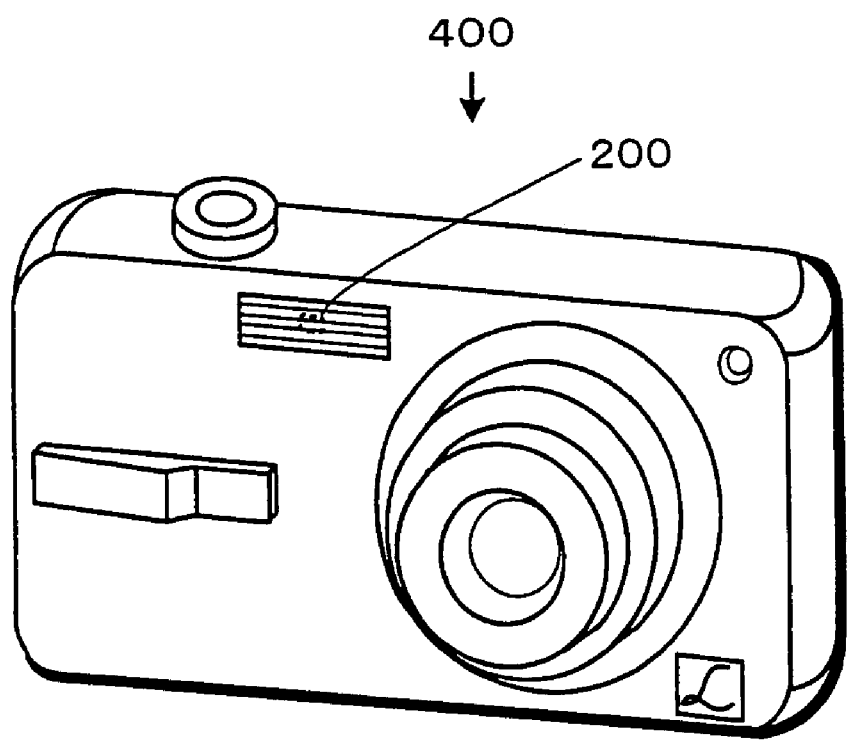
FIG. 15 shows a camera 400 having mounted thereon the lighting device 200 as a strobe light for photographing.

FIG. 15 shows a camera 400 having mounted thereon the lighting device 200 as a strobe light for photographing.

Note that a camera having mounted thereon the semiconductor light emitting device 100 is not limited to the camera 400 shown in FIG. 15, and may be any camera such as a digital still camera, a silver salt camera, and video camera that each uses the semiconductor light emitting device 100 as a strobe light for still images and a light for moving images.

As has been described, the camera according to the embodiment of the present invention can exhibit the same effect that is exhibited by the above-described semiconductor light emitting device. Especially, improvement in luminous efficiency of cameras is expected to realize photographing using EV values lower than conventional values, extension of a battery life, size-reduction, and the like in cameras.

INDUSTRIAL APPLICABILITY

The present invention can be applied to lighting devices of mobile apparatuses such as mobile communication apparatuses and cameras.

The invention claimed is:

1. A semiconductor light emitting device comprising:
a mount member; and
a semiconductor light emitting element on said mount member, said mount member including:
 a substrate;
 an electrode assembly on a top surface of said substrate and contacting said semiconductor light emitting element; and
 a reflecting member on said top surface and arranged out of contact with said semiconductor light emitting element and said electrode assembly, said electrode assembly including:
  an electrode; and an intervening member electrically connecting said semiconductor light emitting element and said electrode;

wherein said reflecting member is made of Ag or an alloy including Ag; and said electrode is made of one of Au, Pt, Cu, Ni, Rh, and Al or an alloy including one of Au, Pt, Cu, Ni, Rh, and Al such that:

when said electrode is made of Au or an alloy including Au as a main component, a wavelength of light emitted from said semiconductor light emitting element is substantially in a range of 340 nm to 800 nm inclusive;

when said electrode is made of Pt or an alloy including Pt as a main component, the wavelength is substantially in a range of 350 nm to 800 nm inclusive;

when said electrode is made of Cu or an alloy including Cu as a main component, the wavelength is substantially in a range of 350 nm to 800 nm inclusive;

when said electrode is made of Ni or an alloy including Ni as a main component, the wavelength is substantially in a range of 340 nm to 800 nm inclusive;

when said electrode is made of Rh or an alloy including Rh as a main component, the wavelength is substantially in a range of 370 nm to 800 nm inclusive; and when said electrode is made of Al or an alloy including Al as a main component, the wavelength is substantially in a range of 460 nm to 800 nm inclusive;

wherein said reflecting member has spheres formed on at least part thereof, and a curvature of each of the spheres decreases as a distance from said semiconductor light emitting element increases.

2. The semiconductor light emitting device of claim 1, wherein said reflecting member has a higher light reflectance than said electrode.

3. The semiconductor light emitting device of claim 2, wherein:
said reflecting member is made of metal; and
said electrode is less affected by electromigration than said reflecting member.

4. The semiconductor light emitting device of claim 1, wherein said reflecting member is made of any of: an alloy including Ag; an alloy including Ag, Bi, and Nd; and an alloy including Ag, Au, and Sn.

5. The semiconductor light emitting device of claim 1, wherein said substrate includes Si.

6. The semiconductor light emitting device of claim 1, wherein said reflecting member includes an open portion not covered with said semiconductor light emitting element.

7. The semiconductor light emitting device of claim 1, wherein said reflecting member has a portion having a vertical height increasing as a distance from said semiconductor light emitting element increases.

8. The semiconductor light emitting device of claim 1, further comprising a transmittance converting unit operable to cover at least part of said semiconductor light emitting element and at least part of said reflecting member.

9. The semiconductor light emitting device of claim 1, wherein said reflecting member has a portion configured such that reflectance of light of said portion emitted from said semiconductor light emitting element increases as a distance from said semiconductor light emitting element increases.

10. The semiconductor light emitting device of claim 1, further comprising a first element electrode and a second element electrode on a main surface of said semiconductor light emitting element, wherein:
said electrode comprises a first substrate electrode and a second substrate electrode on said mount member:
said first element electrode is electrically connected with said first substrate electrode via a first micro bump of said intervening member; and
said second element electrode is electrically connected with said second substrate electrode via a second micro bump of said intervening member.

11. The semiconductor light emitting device of claim 1, further comprising a lens unit arranged in a main light emitting direction of said semiconductor light emitting device.

12. A mobile communication apparatus comprising said semiconductor light emitting device of claim 1.

13. A camera comprising said semiconductor light emitting device of claim 1.

14. A method of manufacturing said semiconductor light emitting device of claim 1, said method:
forming an electrode assembly on a top surface of a substrate;
forming a protective film on the electrode assembly and a portion adjacent thereto;
forming a film of a reflecting member on substantially all of a top surface on which the protective film is formed and the reflecting member is to be formed; and
removing the protective film and the film of the reflecting member formed on the protective film.

15. A semiconductor light emitting device comprising:
a mount member; and
a semiconductor light emitting element on said mount member, said mount member including:
a substrate;
an electrode assembly on a top surface of said substrate and contacting said semiconductor light emitting element; and
a reflecting member on said top surface and arranged out of contact with said semiconductor light emitting element and said electrode assembly, said electrode assembly including:
an electrode; and
an intervening member electrically connecting said semiconductor light emitting element and said electrode;
wherein said reflecting member is made of Al or an alloy including Al; and said electrode is made of one of Au, Pt, Ni, and Rh or an alloy including one of Au, Pt, Ni, and Rh such that:
when said electrode is made of Au or an alloy including Au as a main component, a wavelength of light emitted from said semiconductor light emitting element is substantially in a range of 200 nm to 600 nm inclusive;
when said electrode is made of Pt or an alloy including Pt as a main component, the wavelength is substantially in a range of 200 nm to 800 nm inclusive;
when said electrode is made of Ni or an alloy including Ni as a main component, the wavelength is substantially in a range of 200 nm to 800 nm inclusive; and
when said electrode is made of Rh or an alloy including Rh as a main component, the wavelength is substantially in a range of 370 nm to 800 nm inclusive;

wherein said reflecting member has spheres formed on at least part thereof, and a curvature of each of the spheres decreases as a distance from said semiconductor light emitting element increases.

16. The semiconductor light emitting device of claim 15, wherein said reflecting member has a higher light reflectance than said electrode.

17. The semiconductor light emitting device of claim 16, wherein:
   said reflecting member is made of metal; and
   said electrode is less affected by electromigration than said reflecting member.

18. The semiconductor light emitting device of claim 15, wherein said reflecting member is made of any of: Al; and an alloy including Al; and an alloy including Al, and Nd.

19. The semiconductor light emitting device of claim 15, wherein said substrate includes Si.

20. The semiconductor light emitting device of claim 15, wherein said reflecting member includes an open portion not covered with said semiconductor light emitting element.

21. The semiconductor light emitting device of claim 15, wherein said reflecting member has a portion having a vertical height increasing as a distance from said semiconductor light emitting element increases.

22. The semiconductor light emitting device of claim 15, further comprising a transmittance converting unit operable to cover at least part of said semiconductor light emitting element and at least part of said reflecting member.

23. The semiconductor light emitting device of claim 15, wherein said reflecting member has a portion configured such that reflectance of light of said portion emitted from said semiconductor light emitting element increases as a distance from said semiconductor light emitting element increases.

24. The semiconductor light emitting device of claim 15, further comprising a first element electrode and a second element electrode on a main surface of said semiconductor light emitting element, wherein:
   said electrode comprises a first substrate electrode and a second substrate electrode on said mount member:
   said first element electrode is electrically connected with said first substrate electrode via a first micro bump of said intervening member; and
   said second element electrode is electrically connected with said second substrate electrode via a second micro bump of said intervening member.

25. The semiconductor light emitting device of claim 15, further comprising a lens unit arranged in a main light emitting direction of said semiconductor light emitting device.

26. A mobile communication apparatus comprising said semiconductor light emitting device of claim 15.

27. A camera comprising said semiconductor light emitting device of claim 15.

28. A method of manufacturing said semiconductor light emitting device of claim 15, said method:
   forming an electrode assembly on a top surface of a substrate;
   forming a protective film on the electrode assembly and a portion adjacent thereto;
   forming a film of a reflecting member on substantially all of a top surface on which the protective film is formed and the reflecting member is to be formed; and
   removing the protective film and the film of the reflecting member formed on the protective film.

* * * * *